United States Patent
Arai et al.

(10) Patent No.: US 7,675,360 B2
(45) Date of Patent: Mar. 9, 2010

(54) POWER CONTROL CIRCUIT AND POWER CONTROL METHOD

(75) Inventors: Tomoyuki Arai, Kawasaki (JP); Takao Sasaki, Kawasaki (JP); Shinji Yamaura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/244,972

(22) Filed: Oct. 3, 2008

(65) Prior Publication Data

US 2009/0167435 A1 Jul. 2, 2009

(30) Foreign Application Priority Data

Dec. 28, 2007 (JP) .............................. 2007-339536

(51) Int. Cl.
*H03G 3/20* (2006.01)

(52) U.S. Cl. ...................................... 330/129; 330/133

(58) Field of Classification Search ................. 330/140, 330/133, 279, 129, 98, 150, 310, 136
See application file for complete search history.

(56) References Cited

U.S. PATENT DOCUMENTS 6,417,730 B1 * 7/2002 Segallis et al. .............. 330/129
7,212,592 B2 * 5/2007 Drapkin et ................... 330/129
7,319,363 B2 * 1/2008 Langenbach et al. ......... 330/279
2005/0136872 A1 6/2005 Yoshizawa et al.

FOREIGN PATENT DOCUMENTS

| JP | 11-177371 | 7/1999 |
|---|---|---|
| JP | 2002-111418 | 4/2002 |
| JP | 2005-167519 | 6/2005 |

* cited by examiner

*Primary Examiner*—Robert Pascal
*Assistant Examiner*—Hieu P Nguyen
(74) *Attorney, Agent, or Firm*—Katten Muchin Rosenman LLP

(57) ABSTRACT

A power control circuit includes: a fine adjustment variable amplifying unit configured to amplify the input signal in accordance with a first gain set value; a coarse adjustment variable amplifying unit configured to amplify the input signal in accordance with a second gain set value; a branching unit configured to branch an output signal into a feedback signal; a comparing unit configured to compare a gain value between the input signal and the output signal with the required gain set value; a control unit configured to determine the first gain set value and the second gain set value based on the required gain set value; and an adjusting unit configured to adjust the first gain set value and the second gain set value so that the power value of the feedback signal becomes a power value corresponding to the required gain set value.

11 Claims, 20 Drawing Sheets

FIG. 10

| REQUEST GAIN CODE | GAIN CODE OF FINE AMPLIFIER | GAIN CODE OF COARSE AMPLIFIER | GAIN CHARACTERISTIC MODE OF COARSE AMPLIFIER |
|---|---|---|---|
| C0 | CF0 | CC0 | NORMAL MODE |
| ... | ... | ... | |
| C0c | CFx | CC0 | NORMAL MODE |
| ... | ... | ... | |
| C1m | CFm | CC0 | NORMAL MODE |
| ... | ... | ... | |
| C2m | CFm | CC1 | NORMAL MODE |
| ... | ... | ... | |
| C3m | CFm | CC2 | NORMAL MODE |
| ... | ... | ... | |

FIG. 11

| REQUEST GAIN CODE | GAIN CODE OF FINE AMPLIFIER | GAIN CODE OF COARSE AMPLIFIER | GAIN CHARACTERISTIC MODE OF COARSE AMPLIFIER |
|---|---|---|---|
| C0 | CF0 | CC0 | NORMAL MODE |
| ... | ... | ... | ... |
| C0c | CFc | CC1 | SECOND ADJUSTMENT MODE |
| ... | ... | ... | ... |
| C1m | (AFTER CALIBRATION) | (AFTER CALIBRATION) | (AFTER CALIBRATION) |
| ... | ... | ... | ... |
| C2m | (AFTER CALIBRATION) | (AFTER CALIBRATION) | (AFTER CALIBRATION) |
| ... | ... | ... | ... |
| C3m | (AFTER CALIBRATION) | (AFTER CALIBRATION) | (AFTER CALIBRATION) |
| ... | ... | ... | ... |

FIG. 13

| REQUEST GAIN CODE | GAIN CODE OF FINE AMPLIFIER | GAIN CODE OF COARSE AMPLIFIER | GAIN CHARACTERISTIC MODE OF FINE AMPLIFIER |
|---|---|---|---|
| C0 | CF0 | CC0 | NORMAL MODE |
| ⋮ | ⋮ | ⋮ | |
| C1m | CFm | CC0 | NORMAL MODE |
| ⋮ | ⋮ | ⋮ | |
| C2m | CFm | CC1 | NORMAL MODE |
| ⋮ | ⋮ | ⋮ | |
| C3m | CFm | CC2 | NORMAL MODE |
| ⋮ | ⋮ | ⋮ | |

FIG. 14

| REQUEST GAIN CODE | GAIN CODE OF FINE AMPLIFIER | GAIN CODE OF COARSE AMPLIFIER | GAIN CHARACTERISTIC MODE OF FINE AMPLIFIER |
|---|---|---|---|
| C0 | CF0 | CC0 | NORMAL MODE |
| ... | ... | ... | |
| C1m | CFec | CC0 | ADJUSTMENT MODE |
| ... | ... | ... | |
| C2m | (AFTER CALIBRATION) | (AFTER CALIBRATION) | (AFTER CALIBRATION) |
| ... | ... | ... | |
| C3m | (AFTER CALIBRATION) | (AFTER CALIBRATION) | (AFTER CALIBRATION) |
| ... | ... | ... | |

POWER CONTROL CIRCUIT AND POWER CONTROL METHOD

This application claims the benefit of Japanese Patent Application No. 2007-339536 filed on Dec. 28, 2007 in the Japanese Patent Office, the disclosure of which is herein incorporated in its entirety by reference.

BACKGROUND OF THE INVENTION

1. Field of the invention

The present invention relates to a signal power control technology using a variable gain amplifier.

2. Description of the related art

The variable gain amplifier (VGA) is a circuit that variably controls a gain based on a control signal. The variable gain amplifier executes gain control to obtain a gain corresponding to a gain set value called a gain code contained in the control signal. There is a technique of linearly controlling power of an input signal by a power control circuit constructed of a combination of an amplifier, corresponding to this type of variable gain amplifier, capable of finely adjusting a gain adjustment range (which will hereinafter be referred to as a fine amplifier) and an amplifier, corresponding to the variable gain amplifier, having a coarser gain adjustment range than that of the fine amplifier (which will hereinafter be termed a coarse amplifier).

FIG. 16 is a diagram showing a conventional power control circuit. A conventional power control circuit 50 illustrated in FIG. 16 is constructed of a fine amplifier 51, a coarse amplifier 52 and a decoder 53.

FIG. 17 is a graphic chart showing gain characteristics of the fine amplifier 51 and the coarse amplifier 52. The fine amplifier 51 and the coarse amplifier 52 individually amplify the signal to be inputted with the gain characteristics illustrated in FIG. 17. A corresponding relationship between the gain codes inputted to the fine amplifier 51 and the coarse amplifier 52 and the gains, is referred to as a gain characteristic. In FIG. 17, a proportional straight line indicated by AMP. (FINE) on the left side of the graph represents the gain characteristic of the fine amplifier 51, while a black dot on the right side of the graph represents the gain characteristic of the coarse amplifier 52.

The fine amplifier 51 and the coarse amplifier 52 receive control signal (the gain codes in FIG. 17) sent from the decoder 53, and control the gains so as to obtain the gains corresponding to the control signal. According to the example in FIG. 17, the fine amplifier 51, which is supplied with gain codes CF0 through CFm, performs the gain control of the gains from 0 (dB(decibel)) through G1(dB). The coarse amplifier 52, which is supplied with gain codes CC0, CC1, CC2, executes the gain control stepwise such as 0(dB), G1(dB), G2(dB).

The decoder 53 receives the control signal inputted from an external circuit, decodes the control signal, thereby extracting the gain code from this control signal. The gain code sent from the external circuit is a set value representing a request gain, and the power value of the signal output from the conventional power control circuit 50 becomes the power value corresponding to an in-design gain value specified by the gain code. The decoder 53 determines each gain code (which is the gain code shown in FIG. 11) that should be sent to the fine amplifier 51 and the coarse amplifier 52, corresponding to a gain code showing the request gain (which will hereinafter be termed a request gain code). The decoder 53 transmits the thus-determined gain code to the fine amplifier 51 and the coarse amplifier 52, respectively.

FIG. 18 is a graphic chart showing an example of the gain control by the conventional power control circuit 50. According to the example in FIG. 18, if a gain G1x(dB) of the power control circuit 50 is requested, the control signal showing a request gain code C1x is inputted to the power control circuit 50. In the power control circuit 50, the decoder 53 extracts the request gain code C1x from the control signal, and determines the respective gain codes of the fine amplifier 51 and the coarse amplifier 52, which are necessary for acquiring the gain requested with this request gain code C1x. According to the example in FIG. 18, the gain code of the coarse amplifier 52 is determined to be CC1, and the gain code of the fine amplifier 51 is determined to be a code (e.g., CF3) for obtaining the gain (G1x−G1)(dB).

The decoder 53 sends the thus-determined gain code CC1 to the coarse amplifier 52, and also the gain code CF3 to the fine amplifier 51. As a result, as shown in FIG. 18, the output signal controlled with the gain G1x corresponding to the request gain code C1x is output from the power control circuit 50.

According to this type of conventional power control circuit 50, the combination of the two amplifier enables the gain to be finely adjusted with the larger gain range (ranging from 0 to G3 in the example in FIG. 18).

Note that the following document is disclosed as the document of the conventional art related to the invention of the present application. The document is a "Japanese Patent Laid-Open Publication No. H11-177371".

By the way, the conventional power control circuit 50 might, as illustrated in FIG. 19, in some cases, have occurrence of a difference between the gain characteristic that can be taken in design (in specification) of each of the fine amplifier 51 and the coarse amplifier 52 and the gain characteristic that is taken in an actual control operation. The difference between the gain characteristic that can be taken in design and the gain characteristic that is taken in the actual control operation, will hereinafter be referred to as a misalignment in the gain characteristic.

FIG. 19 is a graphic chart showing an example of the misalignments in the gain characteristics of the fine amplifier 51 and the coarse amplifier 52. The example in FIG. 19 shows that in the fine amplifier 51, when a maximum code CFm is inputted, the gain characteristic depicted by a bold solid line in the actual control operation gets smaller by D1(dB) than the in-design gain characteristic depicted by a long chain line. In the coarse amplifier 52, with respect to each gain code, the gain characteristic depicted by the black dot in the actual control operation is larger by D2(dB) than the in-design gain characteristic depicted by double circles. Thinkable causes of the occurrence of the misalignment in the gain characteristic are a manufacturing scatter of each circuit, a fluctuation in characteristic of each circuit that accompanies a change in temperature, etc.

FIG. 20 is a graphic chart showing an example of the misalignment in the gain control in the conventional power control circuit 50. As in the example in FIG. 19, if the misalignment occurs in the gain characteristic of each amplifier, the misalignment as shown in FIG. 20 occurs in the gain control of the conventional power control circuit 50. At this time, if G1(dB) or G2(dB) is requested as the gain, the request gain code C1m or C2m is inputted.

If such a misalignment in the gain characteristic occurs, however, the circuit is bound to enable the linear control to be done, and nevertheless the conventional power control circuit 50 can not actualize a gain range indicated by a dot pattern area in FIG. 20. This gain-uncontrollable gain range will hereinafter be referred to a gain step.

Accordingly, in the conventional power control circuit 50, a scheme for preventing the gains step from occurring involves combining the gain characteristics of the fine amplifier 51 and the coarse amplifier 52 so as to include a sufficient allowance by taking account of the misalignments described above. Namely, a design aims at increasing an overlapped range of the output gains of the fine amplifier 51 and the coarse amplifier 52.

In the conventional power control circuit 50 taking this design technique, however, duplication appears in the gain ranges that can be taken for the fine amplifier 51 and the coarse amplifier 52. Hence, if the misalignment in the gain characteristic does not occur, such a duplicated gain range is not utilized, and the conventional power control circuit 50 can not be therefore said to be a high-efficiency control circuit. As a matter of course, it follows that the conventional power control circuit 50 gets enlarged in circuit scale with futility.

SUMMARY OF THE INVENTION

It is an object of the present invention to provide a technology of executing power control with high efficiency while restraining a circuit scale.

Each of modes of the present invention adopts the following configurations in order to solve the problems given above. Namely, a first mode of the present invention is a power control circuit configured to perform power control of an input signal in accordance with a required gain set value, comprising: a fine adjustment variable amplifying unit configured to amplify the input signal in accordance with a first gain set value; a coarse adjustment variable amplifying unit configured to amplify the input signal in accordance with a second gain set value, wherein a gain control range of the coarse adjustment variable amplifying unit is larger than a gain control range of the fine adjustment variable amplifying unit; a branching unit configured to branch an output signal, which is obtained by amplifying the input signal with the fine adjustment variable amplifying unit and the coarse adjustment variable amplifying unit, into a feedback signal; a comparing unit configured to compare a gain value between the input signal and the output signal with the required gain set value based on the feedback signal; a control unit configured to determine the first gain set value and the second gain set value based on the required gain set value; and an adjusting unit configured to adjust the first gain set value and the second gain set value determined by the control unit so that a power value of the feedback signal becomes a power value corresponding to the required gain set value in accordance with a result of the comparison by the comparing unit.

According to the first mode of the present invention, the input signal is power-controlled by the fine adjustment variable amplifying unit and the coarse adjustment variable amplifying unit with the gains corresponding to the first gain set value and the second gain set value, which are determined by the control unit on the basis of the required gain set value, and then output. The signal to be output is branched by the branching unit and then fed back. The first gain set value and the second gain set value, determined by the control unit, are adjusted by the adjusting unit, corresponding to a result of comparing a gain value between the input signal and the output signal with the required gain set value based on the feedback signal.

With this configuration, according to the power control circuit in the first mode of the present invention, even when the misalignment in the gain characteristic occurs in the fine adjustment variable amplifying unit and the coarse adjustment variable amplifying unit, the gain value is controlled to the gain value corresponding to the required gain set value, whereby the output signal having the desired power can be obtained. Further, according to the first mode of the present invention, there is no necessity for providing the duplication in the respective gain ranges of the fine adjustment variable amplifying unit and the coarse adjustment variable amplifying unit in order to obtain such an effect, and the circuit scale is not increased with futility.

Further, in the first mode of the present invention, preferably, the coarse adjustment variable amplifying unit may be configured to amplify the input signal with different gain values between a normal operation mode and an adjustment operation mode for the same second gain set value. In this case, the adjusting unit may, if the comparing unit determines that the power value of the feedback signal is larger than the power value corresponding to the required gain set value, instructs the coarse adjustment variable amplifying unit to switch an operation mode from the normal operation mode to the adjustment operation mode (which will hereinafter be referred to as a first preferred mode).

In the first preferred mode, the adjusting unit determines whether or not the power value of the feedback signal is larger than the power value corresponding to the required gain set value. This determination implies the detection of the gain step that occurs due to the misalignment in the gain characteristic.

The adjusting unit stepwise changes, e.g., the first gain set value of the fine adjustment variable amplifying unit with a narrow (small) gain control range so that the power value of the feedback signal gets equal to the power value corresponding to the required gain set value, and changes, if not still satisfied, the second gain set value of the coarse adjustment variable amplifying unit with a coarse gain control range. As a result of the adjustment by the adjusting unit, a reason why the power value of the feedback signal gets larger than the power value corresponding to the required gain set value lies in the occurrence of the gain step.

When this gain step is detected, the coarse adjustment variable amplifying unit is instructed to switch the operation mode from the normal operation mode to the adjustment operation mode, and the coarse adjustment variable amplifying unit operates in the adjustment operation mode. With this scheme, the gain step occurring when the coarse adjustment variable amplifying unit operates in the normal operation mode can be eliminated because of being able to obtain a gain value different from that in the normal operation mode due to the switch to the adjustment operation mode. This is because the gain control range of the coarse adjustment variable amplifying unit can be, though coarser than the gain control range of the fine adjustment variable amplifying unit, made smaller (narrower). The coarse adjustment variable amplifying unit in such a configuration is constructed to have the narrower gain control range under the gain control in the adjustment operation mode than under the gain control in the normal operation mode.

According to the first preferred mode, the coarse adjustment variable amplifying unit, if the misalignment in the gain characteristic does not occur, operates in the normal operation mode with the large gain control range and operates, if the gain step occurs, in the adjustment operation mode with the smaller gain control range. Thus, the power control can be performed more efficiently by switching the operation modes of the coarse adjustment variable amplifying unit, depending on whether it is the normal time or the gain step occurrence case.

Further, in the first mode of the present invention, preferably, the fine adjustment variable amplifying unit may be configured to amplify the input signal with different gain control ranges between a normal operation mode and an adjustment operation mode, wherein the gain control range in the adjustment operation mode is larger than a gain control range in the normal operation mode corresponding to an expanded first gain set value. In this case, the adjusting unit may, if the comparing unit determines that the power value of the feedback signal is larger than the power value corresponding to the required gain set value, instruct the fine adjustment variable amplifying unit to switch an operation mode from the normal operation mode to the an adjustment operation mode and adjusts the first gain set value to the expanded first gain set value (which will hereinafter be referred to as a second preferred mode).

According to the second preferred mode, similarly to the first preferred mode, the gain step is detected by the adjusting unit. When the gain step is detected, the fine adjustment variable amplifying unit is instructed to switch the operation mode from the normal operation mode to the adjustment operation mode and receives the expanded first gain set value and the fine adjustment variable amplifying unit operates in the adjustment operation mode. With this scheme, the gain step occurring when the fine adjustment variable amplifying unit operates in the normal operation mode can be eliminated because of being able to acquire the gain in the range beyond the range of the gains that can be taken in the normal operation mode due to the switch to the adjustment operation mode. This is because the gain control range of the fine adjustment variable amplifying unit is more expanded than in the normal operation mode by using the expanded first gain set value. The fine adjustment variable amplifying unit in such a configuration is constructed to enable the totally large gain range to be taken under the gain control in the adjustment operation mode than under the gain control in the normal operation mode.

According to the second preferred mode, the fine adjustment variable amplifying unit operates in the normal operation mode if the misalignment in the gain characteristic does not occur, and operates, if the gain step occurs, in the adjustment operation mode with the expanded gain control range. Thus, the power control can be performed more efficiently by changing the gain set value sent to the fine adjustment variable amplifying unit, depending on whether it is the normal time or the gain step occurrence case.

Still further, in the first mode of the present invention, preferably, the power control circuit may further comprise a calibrating unit configured to determine the required gain set value in simulation when receiving a calibration signal and a calibration instruction signal, wherein the comparing unit may compare a gain value between the calibration signal and the output signal after receiving the calibration signal with the required gain set value determined by the calibrating unit based on the feedback signal after receiving the calibration signal, and the adjusting unit may, if the power value of the feedback signal after receiving the calibration signal becomes the power value corresponding to the required gain set value determined by the calibrating unit through the adjustment corresponding to a result of the comparison by the comparing unit, perform setting in the control unit so that the then-determined first gain set value and the then-determined second gain set value are immediately determined when the required gain set value, that is equal to the required gain set value determined by the calibrating unit, is sent from outside.

If this configuration is applied to the first preferred mode, the adjusting unit may be constructed to, if the power value of the feedback signal after receiving the calibration signal becomes larger than the power value corresponding to the required gain set value determined by the calibrating unit, perform the setting in the control unit so as to instruct the coarse adjustment variable amplifying unit to switch the operation modes immediately when the required gain set value is sent from outside.

On the other hand, if this configuration is applied to the second preferred mode, the adjusting unit is constructed to, if the power value of the feedback signal after receiving the calibration signal becomes larger than the power value corresponding to the required gain set value determined by the calibrating unit, perform setting in the control unit so as to instruct the fine adjustment variable amplifying unit to switch the operation modes immediately when the required gain set value thereof is sent from outside.

In this configuration, when in the calibration, the result of the adjustment by the adjusting unit is set previously by using the required gain set value determined in simulation by the calibrating unit. With this scheme, when in the normal operation, the control unit can thereafter determine immediately the first gain set value and the second gain set value in a status of taking account of the misalignment in the gain characteristic.

Accordingly, when in the normal operation, it is unnecessary for the adjusting unit to execute the adjusting process, power consumption can be restrained, and the faster power control can be actualized.

It should be noted that another mode of the present invention may be a method of making a computer, an IC chip, etc realize any functions described above. Moreover, still another mode of the present invention may be a program for getting any functions realized and may also be a storage medium recorded with such a program which can be read by the computer.

According to the modes of the present invention, it is feasible to realize the technology of performing the high-efficiency power control while restraining the circuit scale.

BRIEF DESCRIPTION OF THE DRAWINGS

FIG. 10 is a diagram showing an example of gain characteristic information held by a decoder;

FIG. 11 is a diagram showing an example of the gain characteristic information after being calibrated by a calibrator;

FIG. 13 is a diagram showing an example of the gain characteristic information held by the decoder in the fourth embodiment;

FIG. 14 is a diagram showing an example of the gain characteristic information after being calibrated by the calibrator;

DESCRIPTION OF THE PREFERRED EMBODIMENTS

A power control circuit according to a best mode (which will hereinafter be termed an embodiment) for carrying out the present invention will hereinafter be described with reference to the drawings. The power control circuit in the embodiment of the present invention is included in a signal processing circuit mounted in a wireless transmitter/receiver of, e.g., a mobile terminal, base station equipment, etc. the power control circuit in the embodiment does not limit devices mounted with this power control circuit and is mounted in a circuit requested to control variably a gain of a predetermined signal such as an analog signal and a digital signal. Configurations in the following embodiments are exemplifications, and the present invention is not limited to the configurations in the embodiments.

First Embodiment

The power control circuit in a first embodiment of the present invention will hereinafter be described with reference to the drawings.

[Circuit Configuration]

Figure 1:
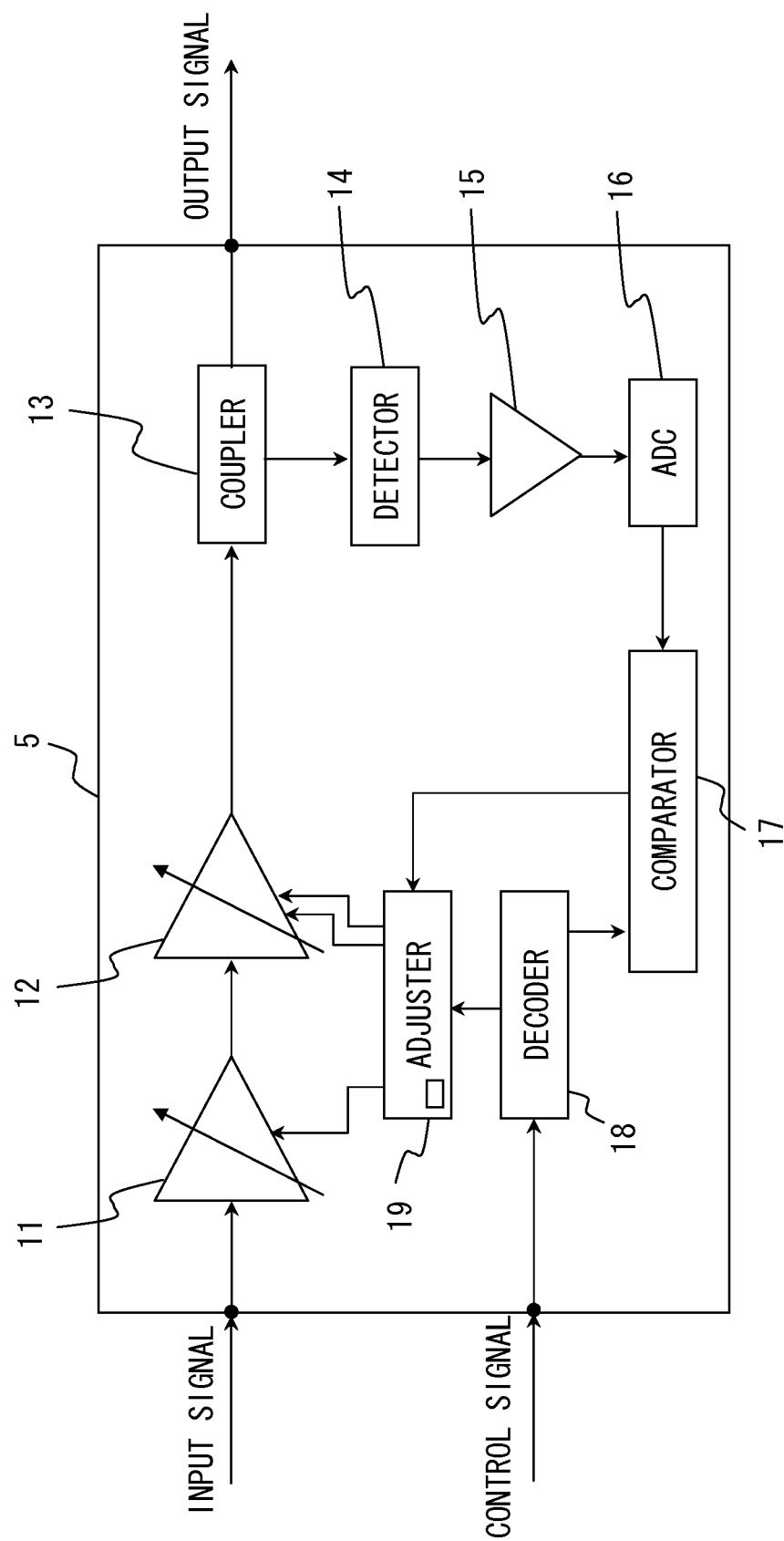
FIG. 1 is a function block diagram showing an outline of a circuit configuration of a power control circuit in a first embodiment.

To start with, a functional configuration of the power control circuit in the first embodiment will be explained with reference to FIG. 1. FIG. 1 is a function block diagram showing an outline of a circuit configuration of the power control circuit in the first embodiment. Respective function units of a power control circuit 5 in the first embodiment are realized by way of software components or hardware components or a combination thereof (refer to the section [Others]).

The power control circuit 5 in the first embodiment receives an input signal as an actual signal and a control signal containing a request gain code, controls this input signal so as to become a gain value corresponding to the request gain code contained in the control signal, and outputs a controlled signal. The request gain code corresponds to a required gain set value according to a first mode of the present invention.

The power control circuit 5 in the first embodiment includes, for performing the variable gain control, a fine amplifier 11, a coarse amplifier 12, a branching unit (coupler) 13, a power detection unit (detector) 14, an adjustment amplifier 15, an analog/digital converter (which will hereinafter be abbreviated to ADC)16, a comparator 17, a decoder 18, an adjuster 19, etc. The fine amplifier 11 corresponds to fine adjustment variable amplifying unit according to the first mode of the present invention. The coarse amplifier 12 corresponds to a coarse adjustment variable amplifying unit according to the first mode of the present invention.

The fine amplifier 11 controls the input signal so as to become a gain value corresponding to a gain code sent from the adjuster 19. The fine amplifier 11 has a gain characteristic as shown on the left side of a graph illustrated in FIG. 2 in terms of a design by way of a relationship between the gain code sent from the adjuster 19 and the gain value corresponding to this gain code. The gain code sent from the adjuster 19 to the fine amplifier 11 corresponds to a first gain set value in the first mode of the present invention.

Figure 2:
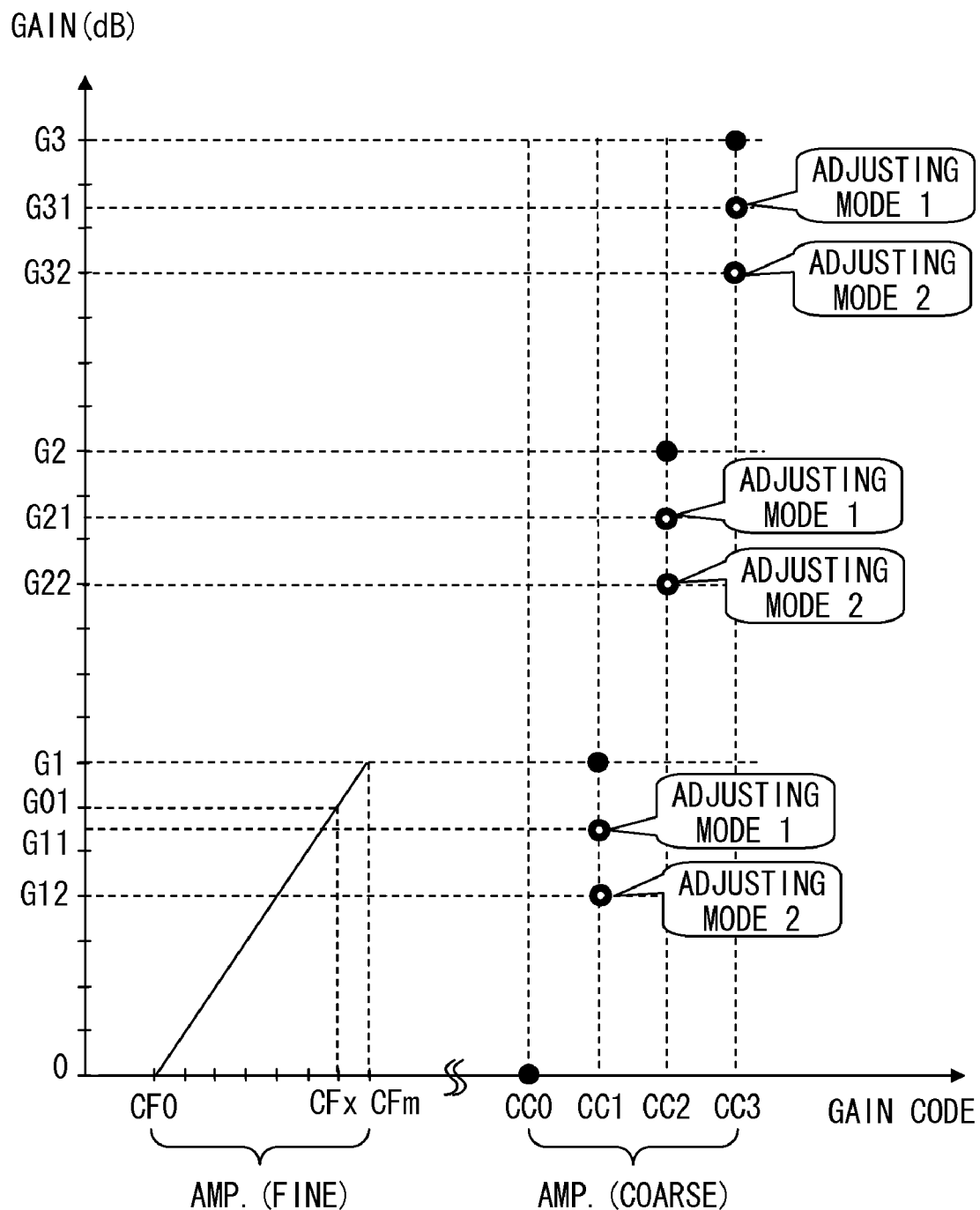
FIG. 2 is a graphic chart showing in-design gain characteristics of a fine amplifier and a coarse amplifier in the first embodiment.

FIG. 2 is a graph showing in-design gain characteristics of the fine amplifier 11 and the coarse amplifier 12 in the first embodiment. As shown in FIG. 2, the fine amplifier 11 receives respective gain codes CF0 through CFm from the adjuster 19, and power-controls the input signal with gains 0(dB) through G1(dB) corresponding to the individual gain codes. According to an example in FIG. 2, the fine amplifier 11 actualizes, in terms of the design, the gain G01(dB) when receiving the gain code CFx.

Figure 19:
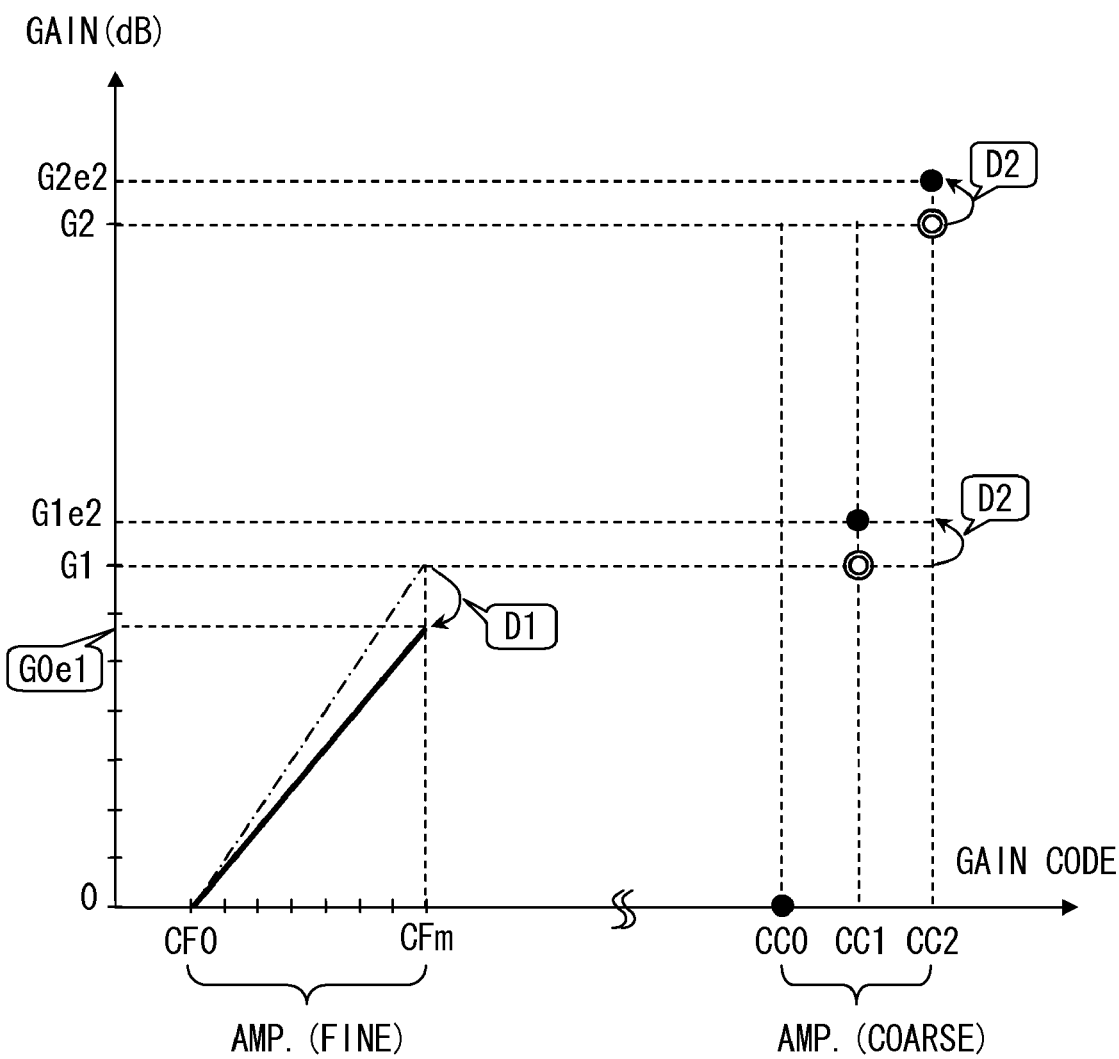
FIG. 19 is a graphic chart showing an example of misalignments in the gain characteristics in the fine amplifier and the coarse amplifier.
Figure 20:
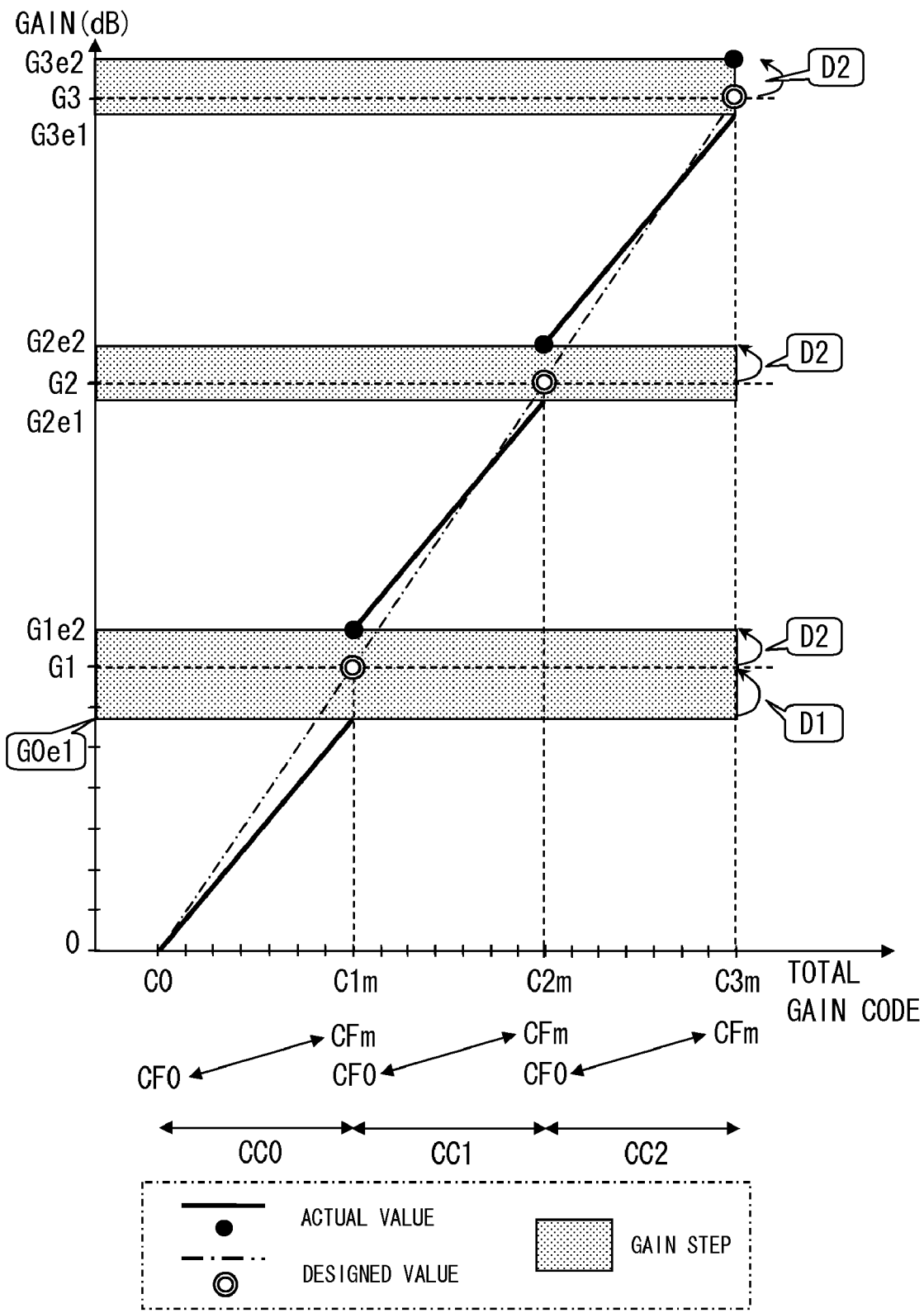
FIG. 20 is a graphic chart showing an example of a misalignment in the gain control in the conventional power control circuit.

However, the gain of the signal, which is actually output from the fine amplifier 11, has a misalignment as shown in FIG. 19 that occurs accompanying a manufacturing scatter and a change in temperature. The signal, which is thus gain-controlled including the misalignment by the fine amplifier 11, is transmitted to the coarse amplifier 12.

The coarse amplifier 12 receives, as the input signal, the signal output from the fine amplifier 11, and controls this input signal with the gain corresponding to the gain code sent from the adjuster 19. The coarse amplifier 12 has a gain characteristic as shown on the right side of the graph illustrated in FIG. 2 in terms of the design by way of the relationship between the gain code sent from the adjuster 19 and the gain corresponding to this gain code. The coarse amplifier 12, as indicated by black dots on the right side of the graph, in terms of the design, receives respective gain codes CC0, CC1, CC2, CC3 from the adjuster 19, and power-controls the input signals with respective gains 0(dB), G1(dB), G2(dB), G3(dB) corresponding to the input gain codes. The gain code sent from the adjuster 19 to the coarse amplifier 12 corresponds to a second gain set value in the first mode of the present invention.

The coarse amplifier 12 in the first embodiment has further 2-stage gain characteristics as indicated by hollowed black dots on the right side of the graph in FIG. 2 in addition to the gain characteristic described above. These respective stages will hereinafter be expressed respectively as a normal mode, a first adjustment mode and a second adjustment mode, but generically termed a gain characteristic mode. The coarse amplifier 12 in the first embodiment has the gain characteristics totally at the three stages such as the normal mode, the first adjustment mode and the second adjustment mode.

To be specific, in the first adjustment mode, the gain corresponding to the gain code CC1 is changed to G11(dB), the gain corresponding to the gain code CC2 is changed to G21 (dB), and the gain corresponding to the gain code CC3 is changed to G31(dB). In the second adjustment mode, the gain corresponding to the gain code CC1 is changed to G12(dB), the gain corresponding to the gain code CC2 is changed to G22(dB), and the gain corresponding to the gain code CC3 is changed to G32(dB).

The coarse amplifier 12 is given a gain characteristic mode transit instruction together with the gain code from the adjuster 19. The gain characteristic mode transit instruction sent to the coarse amplifier 12 from the adjuster 19 may be transmitted via a dedicated signal line as illustrated in FIG. 1 and may also be transmitted as a predetermined code together with the gain code. Further, the first embodiment has exemplified a case in which the gain codes are set equal between the respective gain characteristic modes, however, the gain codes different from each other may also be allocated among the gain characteristic modes. The signal controlled to become the predetermined gain value including the misalignment by the coarse amplifier 12 is sent to the coupler 13.

A technique for realizing the gain characteristic mode of the coarse amplifier 12 may involve providing, e.g., the adjustment amplifiers for actualizing the individual adjustment modes, providing respective gates for accepting the gain codes of the individual adjustment modes, and also providing a function unit that controls a bias.

The coupler 13 branches AC signal output from the coarse amplifier 12 into a signal output from the power control circuit 5 according to the first embodiment and into a signal transmitted to the detector 14.

The detector 14 detects electric power of the branched signal (AC signal) transmitted from the coupler 13. The detector 14 converts, based on the detected power, the branched signal into a baseband signal. The thus-converted baseband signal is transmitted to the adjustment amplifier 15.

The adjustment amplifier 15 amplifies a weak DC component of the baseband signal. The amplified baseband signal is transmitted to the ADC 16.

The ADC 16 converts an analog baseband signal to be inputted into a digital baseband signal representing the signal power detected by the detector 14. The ADC 16 transmits the converted digital baseband signal to the comparator 17.

The decoder 18 receives the control signal from an external circuit and decodes this control signal, thereby acquiring the request gain code. The acquired request gain code is sent to the comparator 17.

Further, the decoder 18 has a corresponding relationship (gain characteristic information) between the gain code and the gain corresponding to this code with respect to each of the fine amplifier 11 and the coarse amplifier 12. The decoder 18 determines, by use of this gain characteristic information, the respective gain codes sent to the fine amplifier 11 and the coarse amplifier 12 in order to become the gain value corresponding to the request gain code extracted from the control signal. Note that the gain characteristic information, of each amplifier, held by the decoder 18 takes an ideal value in terms of specifications but does not include an addition of the misalignment in the gain characteristic. The decoder 18 sends, to the adjuster 19, the gain code for the fine amplifier 11 and the gain code for the coarse amplifier 12, which are determined based on the ideal value in terms of the specifications.

The comparator 17 acquires electric power value of a feedback signal from the digital baseband signal transmitted from the ADC 16. The comparator 17 has corresponding relationship information between the request gain code and the gain corresponding thereto. The comparator 17 acquires, based on the request gain code sent from the decoder 18 and the corresponding relationship information, the request gain code corresponding to the power value of the feedback signal. The gain code acquired herein corresponds to the power value of the output signal after being the gain-controlled by the power control circuit 5. Hereafter, the request gain code acquired herein will be referred to as a feedback gain code.

The comparator 17 compares the feedback gain code with the request gain code sent from the decoder 18. In other words, the comparator 17 compares the gain value requested from the external circuit with the gain value actualized by the power control circuit 5 in the first embodiment, thus determining whether the actualized gain value is the requested gain value or not. The comparator 17 obtains a difference between the feedback gain code and the request gain code (which will hereinafter be termed a code difference). The comparator 17, when determining that the code difference is not within an allowable range, sends the code difference to the adjuster 19. The comparator 17, if the code difference is larger than a predetermined threshold value retained beforehand in an adjustable manner, may determine that the code difference is not within the allowable range.

The adjuster 19 adjusts, based on the code difference sent from the comparator 17, each gain code taking the ideal value that is transmitted from the decoder 18 in order for the deviated gain to become the gain value corresponding to the request gain code. Conversely, if the code difference is not transmitted from the comparator 17, or if having a value showing that the code difference sent from the comparator 17 is within the allowable range, the adjuster 19 does not adjust each gain code sent from the decoder 18 but transmits the gain code as it is to the fine amplifier 11 and the coarse amplifier 12, respectively.

The adjuster 19 retains gain code lists provided by the fine amplifier 11 and by the coarse amplifier 12 and also retains information on the gain characteristic mode of the coarse amplifier 12. The adjuster 19, when adjusting each gain code transmitted from the decoder 18, utilizes the retained gain code list information.

Moreover, the adjuster 19, on the occasion of adjusting each gain code, determines a transit of the gain characteristic mode of the coarse amplifier 12. The adjuster 19, upon determining the transit of the gain characteristic mode, issues the transit instruction to the coarse amplifier 12. Note that a specific method of adjusting each gain code by the adjuster 19 will be described later on. The adjuster 19 transmits the adjusted gain code to the fine amplifier 11 and to the coarse amplifier 12, and issues the transit instruction to the coarse amplifier 12 as the necessity may arise.

OPERATIONAL EXAMPLE

Figure 3:
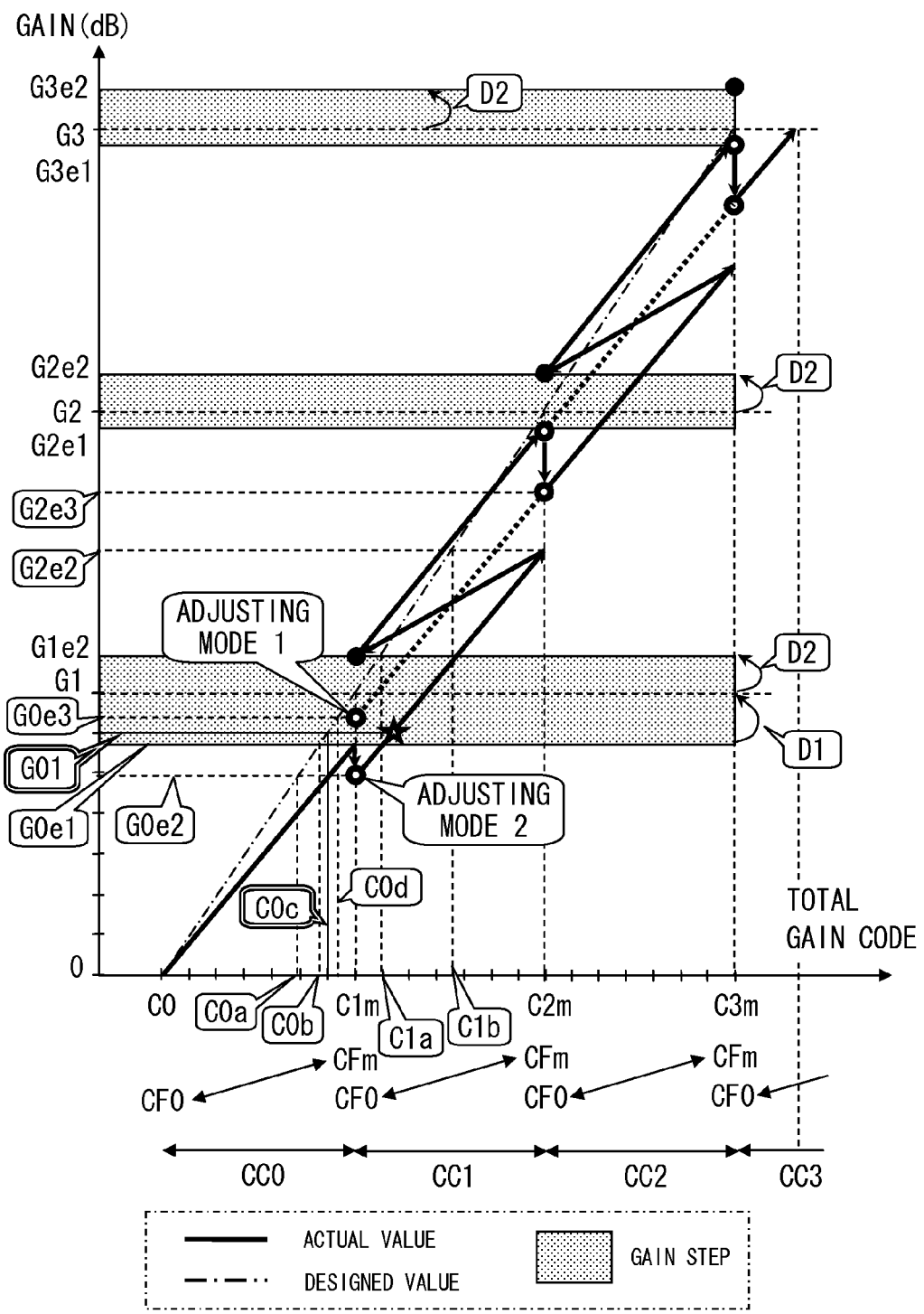
FIG. 3 is a graphic chart showing gain control of the power control circuit in the first embodiment.

Next, an operational example of the power control circuit in the first embodiment discussed above will be explained with reference to FIG. 3. FIG. 3 is a graphic chart showing the gain control of the power control circuit 5 in the first embodiment.

FIG. 3 illustrates an example of the gain control in such a case that a misalignment of the gain characteristic shown in FIG. 19 occurs in the fine amplifier 11 and the coarse amplifier 12, which build up the power control circuit 5. In FIG. 3, a long chain line represents an in-design gain corresponding to the request gain code, a dot pattern area indicates a gain step that occurs in the conventional power control circuit, and a bold solid line represents a gain control method realized by the power control circuit 5 in the first embodiment. As depicted by the bold solid line in FIG. 3, the power control circuit 5 in the first embodiment controls the gain so that the gain step does not occur in the gain.

The operation of the power control circuit 5 in the first embodiment will hereinafter be described by giving an example in which the control signal containing a request gain code C0c corresponding to the request gain G01(dB) is inputted to the power control circuit 5 from the external circuit.

The decoder 18 extracts the request gain code C0c from the control signal. The decoder 18 determines, based on the request gain code C0c, the gain code that should be sent to the fine amplifier 11 and the gain code that should be sent to the coarse amplifier 12. In this example, in order to obtain the request gain G01(dB) corresponding to the request gain code C0c, the decoder 18 determines, as shown in FIG. 2, without adding the misalignment in the gain characteristic, the gain code CFx sent to the fine amplifier 11 and the gain code CC0 sent to the coarse amplifier 12. An assumption herein is that the respective gain codes are not adjusted by the adjuster 19 but transmitted to the fine amplifier 11 and to the coarse amplifier 12, respectively.

The input signal is gain-controlled by the fine amplifier 11 and the coarse amplifier 12 based on the thus-transmitted gain codes, and is branched by the coupler 13 into the signal that is fed back and the signal output from the power control circuit 5 in the first embodiment. The signal fed back after being branched by the coupler 13 is detected in its power by the detector 14, then amplified by the adjustment amplifier 15 and, after being converted into the digital baseband signal by the ADC 16, transmitted to the comparator 17.

The comparator 17 determines, based on the gain corresponding to the request gain code sent from the decoder 18, the feedback gain code corresponding to the power value of the feedback signal. According to the example given above, the gain value of the output signal becomes G0e2 due to the misalignment in the gain characteristic of the fine amplifier 11, and hence the feedback gain code determined by the comparator 17 must be C0a.

On the other hand, the request gain code transmitted to the comparator 17 from the decoder 18 is still C0c, and the gain code of the fine amplifier 11 and the gain code of the coarse amplifier 12, which are sent to the adjuster 19 from the decoder 18, are CFx and CC0, respectively.

The comparator 17 compares the feedback gain code C0a with the request gain code C0c, and computes a difference between these codes. The comparator 17 determines whether the computed code difference is within the allowable range or not. In this case, the comparator 17 determines that the code difference (C0c−C0a) is not allowed, and sends this code difference to the adjuster 19.

The adjuster 19 receives the gain code CFx for the fine amplifier 11 that corresponds to the request gain code, the gain code CC0 for the coarse amplifier 12, and the code difference (C0c−C0a) given from the comparator 17. The adjuster 19 receives the code difference from the comparator 17 and therefore determines that each gain code should be adjusted.

Specifically, the adjuster 19 tries, based on the code difference, to raise the gain code of the fine amplifier 11. In this case, the gain code CFx is smaller than a maximum code CFm of the fine amplifier 11, and therefore the adjuster 19 further raises the gain code CFx. It is herein assumed that the gain code for the fine amplifier 11 is determined to be the maximum code CFm as a result of the adjustment made by the adjuster 19. Note that the first embodiment does not limit an adjustment range of the gain code by the adjuster 19. The gain code may also be adjusted with an adjustment range corresponding to a magnitude of the code difference and may also be adjusted based on a minimum unit of the gain code. The thus-adjusted gain codes (CFm, CC0) are sent to the fine amplifier 11 and the coarse amplifier 12, respectively.

With the thus-sent gain codes, the actual signal, which is gain-controlled by the fine amplifier 11 and the coarse amplifier 12, is fed back again at the coupler 13. An actual gain value of the power control circuit in the first embodiment, which outputs the signal to be fed back, becomes G0e1(dB) due to the misalignment in the gain characteristic of the fine amplifier 11 shown in FIG. 19.

Hence, the comparator 17 determines the feedback gain code to be C0b. The comparator 17 determines whether or not the code difference between the feedback gain code C0b and the request gain code C0c is a difference falling within the allowable range. Herein, the comparator 17 determines that the code difference (C0c−C0b) is not allowed and transmits this code difference to the adjuster 19.

The adjuster 19 receives the gain code CFm for the fine amplifier 11 that has been adjusted last time, the gain code CC0 for the coarse amplifier 12 that has been adjusted last time, and the code difference (C0c−C0b) given from the comparator 17. The adjuster 19 receives the code difference from the comparator 17 and therefore determines that each gain code should be adjusted.

To be specific, the adjuster 19 tries, based on the code difference, to raise again the gain code of the fine amplifier 11. In this case, the gain code CFm is the maximum code of the fine amplifier 11, and consequently the adjuster 19 raises the gain code of the coarse amplifier 12 up to CC1, and resets the gain code of the fine amplifier 11 to an initial value CF0. The thus-adjusted gain codes (CF0, CC1) are sent to the fine amplifier 11 and the coarse amplifier 12, respectively.

With the thus-sent gain codes, the actual signal, which is gain-controlled by the fine amplifier 11 and the coarse amplifier 12, is fed back again at the coupler 13. The actual gain value of the power control circuit in the first embodiment, which outputs the signal to be fed back, becomes G1e2(dB) due to the misalignment in the gain characteristic of the fine amplifier 11 shown in FIG. 19.

Therefore, the comparator 17 determines the feedback gain code to be C1a. The comparator 17 determines whether or not the code difference between the feedback gain code C1a and the request gain code C0c is a difference falling within the allowable range. Herein, the comparator 17 determines that the code difference (C0c−C1a) is not allowed and transmits this code difference to the adjuster 19.

The adjuster 19 receives the gain code CF0 for the fine amplifier 11 that has been adjusted last time, the gain code CC1 for the coarse amplifier 12 that has been adjusted last time, and the code difference (C0c−C1a) given from the comparator 17. The adjuster 19 determines, based on the code difference given from the comparator 17, that the feedback gain code is larger than the request gain code. The adjuster 19 determines, based on this determination, that the gain step occurs because the gain code of the coarse amplifier 12 has been raised in the adjustment of the last time for obtaining the feedback gain code while the gain code of the fine amplifier 11 has been reset.

Upon detecting the occurrence of the gain step, the adjuster 19 determines the transit of the gain characteristic mode of the coarse amplifier 12. To be specific, the adjuster 19 determines the transit from the normal mode defined as the present gain characteristic mode to the first adjustment mode. The adjuster 19 transmits the same individual gain codes (CF0, CC1) as those of the last time to the fine amplifier 11 and the coarse amplifier 12 respectively, and sends an instruction of the transit to the first adjustment mode to the coarse amplifier 12.

The coarse amplifier 12, in response to the transit instruction to the first adjustment mode, makes the self-adjustment so as to have the gain characteristic of the first adjustment mode shown in FIG. 2. Through this adjustment, the fine amplifier 11 and the coarse amplifier 12 transiting to the first adjustment mode control the power of the input signal, corresponding to the gain codes CF0, CC1. The thus-controlled actual signal is fed back gain at the coupler 13. The actual gain value of the power control circuit in the first embodiment, which outputs the signal to be fed back, becomes G0e3(dB) due to the misalignment in the gain characteristic of the coarse amplifier 12 shown in FIG. 19.

Hence, the comparator 17 determines the feedback gain code to be C0d. The comparator 17 determines whether or not the code difference between the feedback gain code C0d and the request gain code C0c is a difference falling within the allowable range. Herein, the comparator 17 determines that the code difference (C0c–C0d) is not allowed and transmits this code difference to the adjuster 19.

The adjuster 19 receives the gain code CF0 for the fine amplifier 11 that has been utilized last time, the gain code CC1 for the coarse amplifier 12 that has been utilized last time, and the code difference (C0c–C0d) given from the comparator 17. The adjuster 19 determines, based on the code difference given from the comparator 17, that the feedback gain code is still larger than the request gain code. The adjuster 19 determines, based on this determination, that the gain step is not eliminated by the transit of the gain characteristic mode of the last time.

Through this operation, the adjuster 19 determines a further transit of the gain characteristic mode of the coarse amplifier 12. Specifically, the adjuster 19 determines the transit of the gain characteristic mode of the coarse amplifier 12 from the first adjustment mode at the present to the second adjustment mode. The adjuster 19 transmits the same individual gain codes (CF0, CC1) as those of the last time to the fine amplifier 11 and the coarse amplifier 12 respectively, and sends an instruction of the transit to the second adjustment mode to the coarse amplifier 12.

The coarse amplifier 12 performs the self-adjustment to have the gain characteristic of the second adjustment mode shown in FIG. 2 in response to the transit instruction to the second adjustment mode. The actual signal, which is gain-controlled by the fine amplifier 11 and the coarse amplifier 12 transiting to the second adjustment mode, is fed back again at the coupler 13. The actual gain value of the power control circuit in the first embodiment, which outputs the signal to be fed back, becomes G0e2(dB) due to the misalignment in the gain characteristic of the coarse amplifier 12 shown in FIG. 19.

Hence, the comparator 17 determines the feedback gain code to be C0a. At this time also, the comparator 17 determines that the code difference between the feedback gain code C0a and the request gain code C0c is not within the allowable range (C0c–C0a), and transmits this code difference to the adjuster 19.

The adjuster 19 receives the gain code CF0 for the fine amplifier 11 and the gain code CC1 for the coarse amplifier 12, which have been adjusted at least time, and the code difference (C0c–C0a) given from the comparator 17. At this time, after transiting to the second adjustment mode, as the feedback gain code C0a gets smaller than the request gain code C0c, the adjuster 19 determines that the gain step have been eliminated. With this determination, the adjuster 19 tries to raise the gain code of the fine amplifier 11 while fixing the gain characteristic of the coarse amplifier 12 in the second adjustment mode. Subsequent to this operation, the adjuster 19 transmits the same gain code CC1 as that of the last time to the coarse amplifier 12 in the second adjustment mode and the gain code adjusted from the gain code CF0 of the last time to the fine amplifier 11.

Hereafter, till the feedback gain code determined by the comparator 17 is equalized to the request gain code C0c or till the difference between both of the codes falls within the allowable range (as indicated by a star symbol depicted in FIG. 3) under the same feedback control as described above, the adjuster 19 adjusts the gain code of the fine amplifier 11. Note that at this time the coarse amplifier 12 is in the second adjustment mode, and the gain code sent to the coarse amplifier 12 is CC1.

Thus, according to the power control circuit 5 in the first embodiment, even if the misalignment in the gain characteristic occurs in the fine amplifier 11 and in the coarse amplifier 12, the gain step can be eliminated by use of the gain characteristic mode of the coarse amplifier 12.

As indicated by the graph in FIG. 3, the gain control can be done with flexibility by stepwise adjusting the gain code of the fine amplifier 11 up to CFm while giving the gain code CC1 to the coarse amplifier 12 in the second adjustment mode till the request gain code C1b corresponding to a request output gain G2e2.

If a gain which is slightly larger than G2e2 is requested as the gain, the transit of the adjusting mode of the coarse amplifier 12 is again performed. In this case, the adjuster 19, the gain code of the fine amplifier 11 being the maximum code CFm, returns the adjustment mode of the coarse amplifier 12 to the normal mode, and resets the gain code of the fine amplifier 11 to CF0. Hereinafter, the gain code of the fine amplifier 11 is adjusted under the feedback control till a desired gain is obtained. At this time, the coarse amplifier 12 is in the normal mode, and the gain code sent to the coarse amplifier 12 is CC1.

Note that before the adjuster 19 determines the transit of the gain characteristic mode of the coarse amplifier 12, the gain code of the coarse amplifier 12 may also be again raised to CC2 while keeping the second adjustment mode. In this case, the gain step between the gains G2e3 and G2e2 occurs, as exemplified in FIG. 3, in the coarse amplifier 12 in the second adjustment mode. Hence, after detecting the gain step, the same transit of the adjustment mode of the coarse amplifier 12 as described above may also be determined. Hereafter, similarly, the transit of the gain characteristic mode of the coarse amplifier 12 is conducted, and meanwhile the gain code of the coarse amplifier 12 and the gain code of the fine amplifier 11 are adjusted, thereby obviating the gain step.

Operation and Effect in First Embodiment

In the power control circuit 5 according to the first embodiment, the decoder 18 extracts the request gain code contained in the control signal transmitted from the external circuit, and further determines the respective gain codes of the fine amplifier 11 and the coarse amplifier 12, which correspond to the request gain code. The gain codes determined by the decoder 18 are corrected (adjusted) by the adjuster 19, corresponding to the code difference, determined by the comparator 17, between the feedback gain code and the request gain code, and then sent to the fine amplifier 11 and the coarse amplifier 12, respectively.

Thus, the power control circuit 5 in the first embodiment includes the feedback circuit (the coupler 13, the detector 14, the adjustment amplifier 15 and the ADC 16) for verifying the signal gain of the output signal that is gain-controlled by the fine amplifier 11 and the coarse amplifier 12. The feedback gain code corresponding to the signal fed back by the feedback circuit is generated by the comparator 17, and the comparator 17 compares this feedback gain code with the request gain code given from the outside, thereby verifying whether the signal gain of the output signal satisfies the request gain code or not.

Moreover, the coarse amplifier 12 included in the power control circuit 5 in the first embodiment is constructed to have the 3-stage gain characteristics such as the normal mode, the first adjustment mode and the second adjustment mode with respect to the corresponding relationship between the respective output gains and the individual gain codes.

In the power control circuit 5 according to the first embodiment, the gain step caused by the misalignment in the gain characteristics of the fine amplifier 11 and the coarse amplifier 12 is detected from the relationship between the feedback gain code and the request gain code.

Specifically, the adjuster 19 sequentially changes the gain code of the fine amplifier 11 up to the maximum code with a predetermined adjustment range, corresponding to the code difference between the feedback gain code to be fed back sequentially and the request gain code. When the gain code of the fine amplifier 11 reaches the maximum code, the gain code of the coarse amplifier 12 is raised, while the gain code of the fine amplifier 11 is reset to the initial value. At this time, the adjuster 19, if it is determined that the feedback gain code becomes to be larger than the request gain code before and after the adjustment, determines that the gain step have occurred.

In the power control circuit 5 according to the first embodiment, when thus detecting the gain step, the adjuster 19 issues the adjustment mode transit instruction together with the gain code to the coarse amplifier 12. With this instruction, the gain characteristic of the coarse adjustment amplifier 12 is changed to have the gain characteristic corresponding to the adjustment mode. Hereafter, the adjuster 19 sequentially corrects the gain code of the fine amplifier 11 on the basis of the code difference with the predetermined adjustment range till the code difference falls within the allowable range. Note that if the gain step is detected even after the gain characteristic mode of the coarse amplifier 12 has transited, the transit of the gain characteristic mode of the coarse amplifier 12 is again determined at the timing of resetting the gain code of the fine amplifier 11.

Thus, the power control circuit 5 in the first embodiment feeds back the information (feedback gain code) about whether the output signal has the requested signal power or not, and detects the gain step based on the information (feedback gain code) to be fed back. When detecting the gain step, the gain characteristic mode of the coarse amplifier 12 transits so as to eliminate the gain step.

Therefore, according to the power control circuit 5 in the first embodiment, the gain control can be done to eliminate the gain step without making the design including a sufficient allowance by taking account of the misalignment in the gain characteristics with respect to the fine amplifier 11 and the coarse amplifier 12. Moreover, there is no necessity for making the design including the allowance, and it is therefore feasible to restrain a circuit scale and power consumption/circuit scale.

Modified Example of First Embodiment

In the first embodiment discussed above, the gain control as depicted by the bold solid line in FIG. 3 is executed. Namely, after the gain characteristic mode of the coarse amplifier 12 has transited to the second adjustment mode, the gain characteristic mode of the coarse amplifier 12 transits to the normal mode at the timing of resetting the gain code of the fine amplifier 11 once again.

Figure 4:
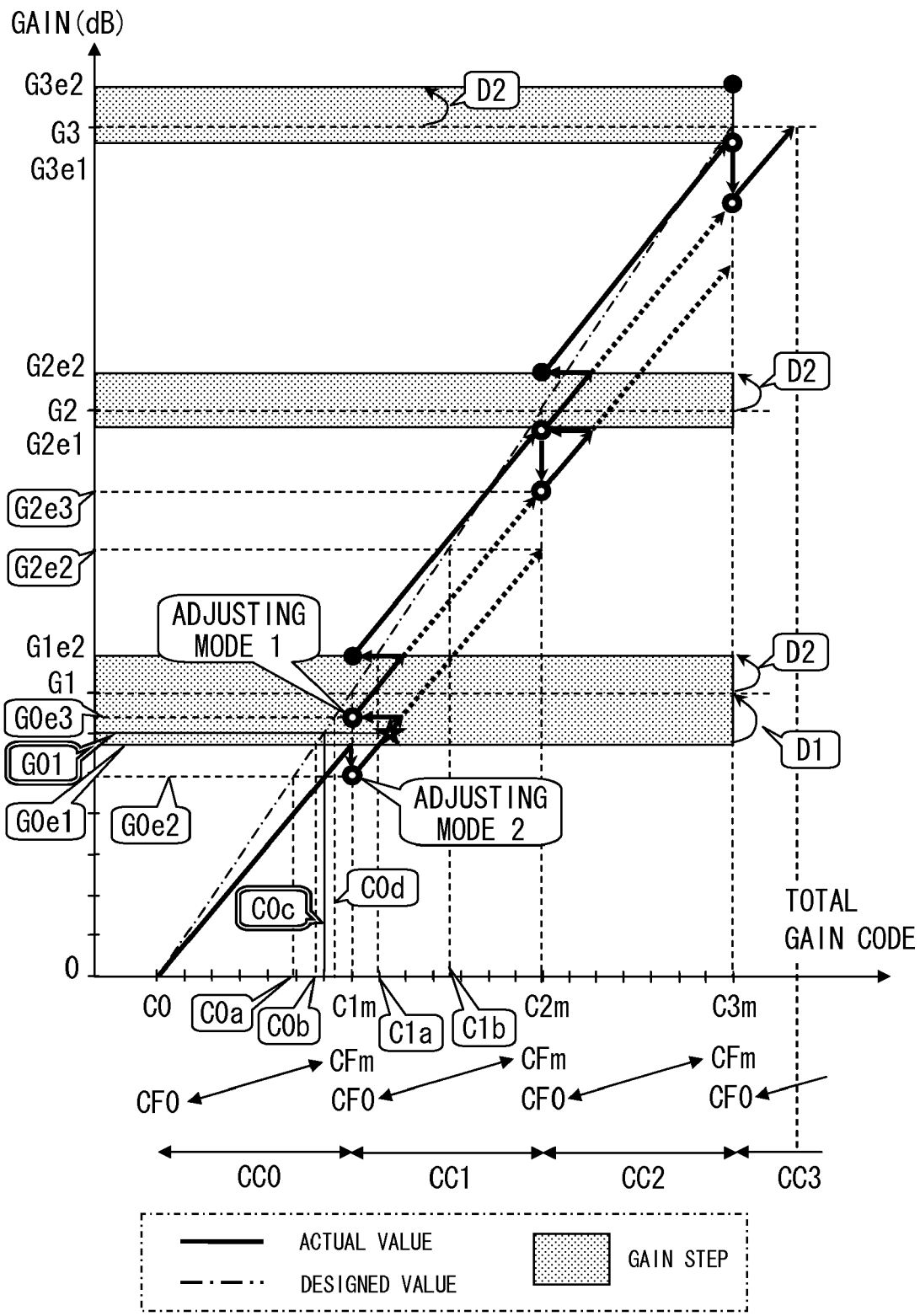
FIG. 4 is a graphic chart showing the gain control in a modified example of the first embodiment.

The first embodiment is not limited to this type of gain control, however, the gain step may be detected from the feedback signal, and the gain characteristic mode of the coarse amplifier 12 may transit so as to eliminate the gain step. FIG. 4 is a graphic chart showing the gain control in the modified example of the first embodiment. The gain characteristic of the power control circuit 5 will hereinafter be described by way of the modified example of the first embodiment.

In the power control circuit 5 in the modified example, as shown in FIG. 4, after the gain characteristic mode of the coarse amplifier 12 has transited to the second adjustment mode, the timing of returning the gain characteristic mode of the coarse amplifier 12 is different from the first embodiment.

The modified example is that the adjuster 19 receives, from the comparator 17, and retains the feedback gain code to be fed back on the occasion of raising the gain code of the coarse amplifier 12 and resetting the gain code of the fine amplifier 11 to the initial value. To be specific, the adjuster 19 in the modified example retains the respective gain codes at the point of time when transiting to the normal mode, the first adjustment mode and the second adjustment mode (in a state where the gain code of the fine amplifier is reset).

The adjuster 19, in the same way as in the first embodiment, after the gain characteristic mode of the coarse amplifier 12 has transited to the second adjustment mode, changes stepwise the gain code of the fine amplifier 11 with the predetermined adjustment range. The adjuster 19 sequentially checks whether or not the feedback gain code sent from the comparator 17 is the same as any one of the feedback gain codes to be retained. The adjuster 19, when determining that the feedback gain code at that time is the same as any one of the feedback gain codes to be retained, determines the transit to the gain characteristic mode corresponding to the feedback gain code to be retained.

In the example in FIG. 4, the adjuster 19, as exemplified in FIG. 3, retains the feedback gain code $C1a$ corresponding to the gain $G1e2$ on the occasion of returning (resetting) the gain code of the fine amplifier 11 to $CF0$ and raising the gain code of the coarse amplifier 12 to $CC1$. Further, the adjuster 19 retains the feedback gain code $C0d$ corresponding to the gain $G0e3$ on such an occasion that the gain characteristic mode of the coarse amplifier 12 transits to the first adjustment mode, and also retains the feedback gain code $C0a$ corresponding to the gain $G0e2$ on such an occasion that the gain characteristic mode of the coarse amplifier 12 transits to the second adjustment mode.

Thereafter, the adjuster 19 gradually raises the gain code of the fine amplifier 11 while sending the gain code $CC1$ to the coarse amplifier 12 in the second adjustment mode. As a result, the adjuster 19 receives the feedback gain code $C0d$ corresponding to the signal gain $G0e3$. The adjuster 19 detects that the feedback gain code $C0d$ has already been retained, and determines the transit to the gain characteristic mode (first adjustment mode) corresponding to the retained feedback gain code $C0d$.

The adjuster 19 simultaneously resets the gain code of the fine amplifier 11 to the initial value $CF0$. As a result, the adjuster 19 sends the gain code $CF0$ to the fine amplifier 11, issues the transit instruction to the first adjustment mode to the coarse amplifier 12, and transmits the gain code $CC1$ to the coarse amplifier 12.

Under the control being thus conducted, according to the present modified example, the output gains, which are redundantly acquired before and after the gain characteristic mode of the coarse amplifier 12 has transited, can be reduced. It is therefore feasible to decrease the time expended till the output gain corresponding to the request gain code is acquired and to realize the fast gain control.

Second Embodiment

Next, the power control circuit in a second embodiment of the present invention will hereinafter be described with reference to the drawings. The power control circuit 5 in the first embodiment performs the gain control to eliminate the gain step by providing the gain characteristic mode in the coarse amplifier 12 and causing the transit of this gain characteristic mode. The power control circuit 5 in the second embodiment executes the gain control to eliminate the gain step by providing the gain characteristic mode in the fine amplifier 11 and causing the transit of this gain characteristic mode.

[Circuit Configuration]

Figure 5:
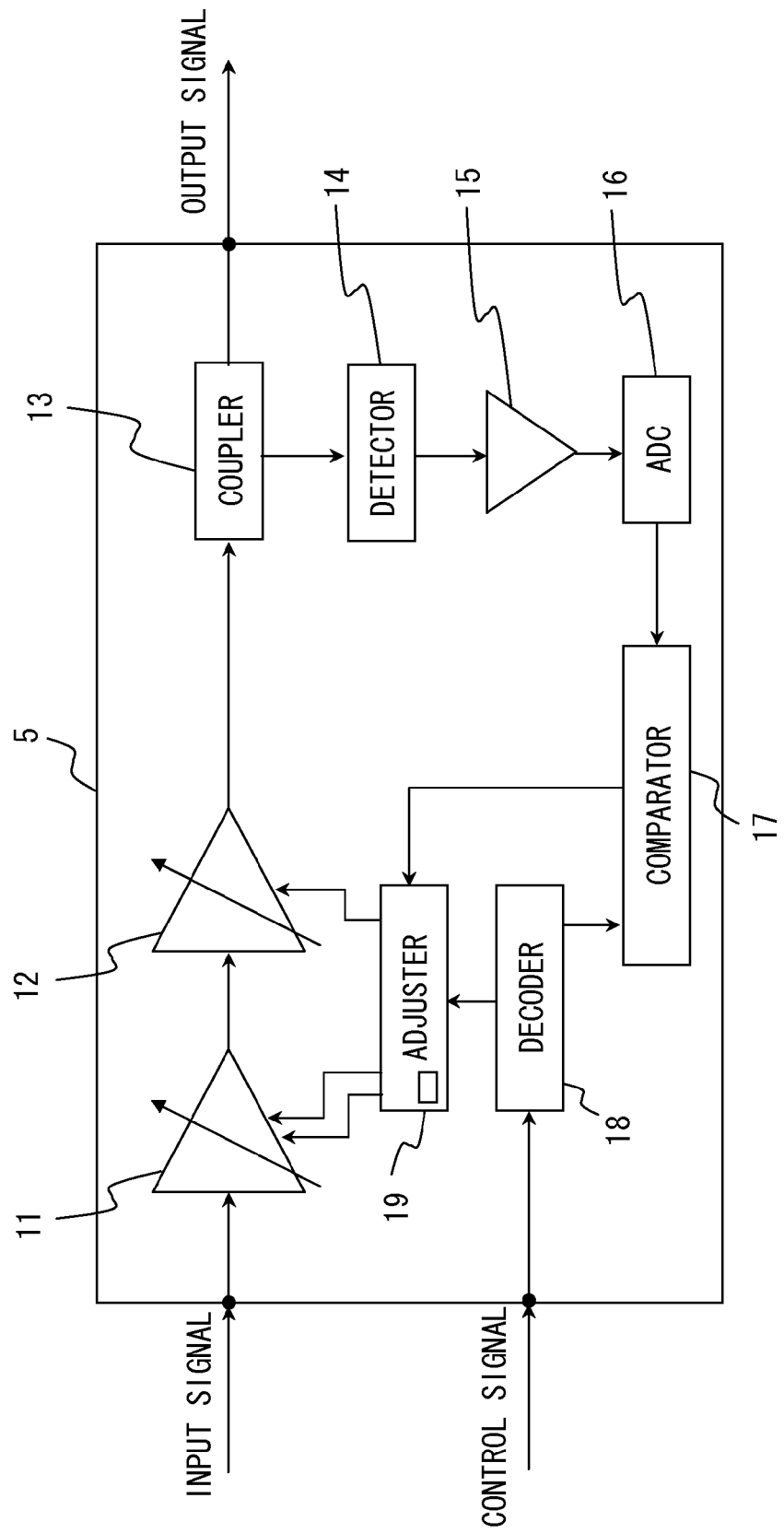
FIG. 5 is a function block diagram showing an outline of the circuit configuration of the power control circuit in a second embodiment.

A functional configuration of the power control circuit in the second embodiment will be described with reference to FIG. 5. FIG. 5 is a function block diagram showing an outline of the circuit configuration of the power control circuit in the second embodiment. The power control circuit 5 in the second embodiment has such a scheme that the gain characteristic mode of the fine amplifier 11 transits, as compared with the transit of the gain characteristic mode of the coarse amplifier 12 in the power control circuit 5 according to the first embodiment. The following discussion on the second embodiment will be focused on the function units having the functions different from those in the first embodiment.

Figure 6:
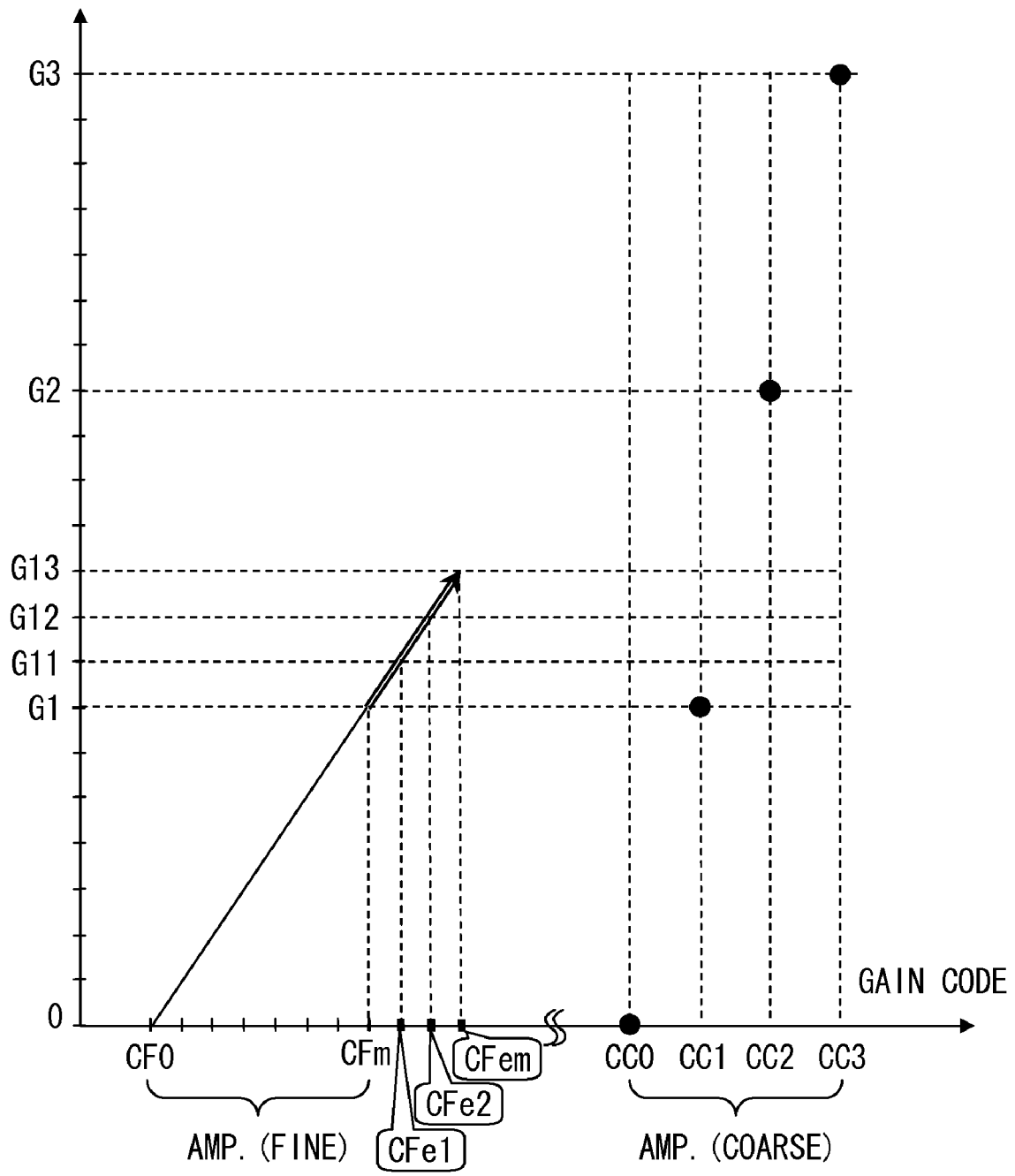
FIG. 6 is a graphic chart showing gain characteristics of the fine amplifier and a coarse amplifier in the second embodiment.

FIG. 6 is a graphic chart showing the gain characteristics of the fine amplifier 11 and the coarse amplifier 12 in the second embodiment. As shown on the right side of the graph in FIG. 6, the gain characteristic of the coarse amplifier 12 is the same as in the first embodiment except having none of the gain characteristic mode.

On the other hand, the fine amplifier 11, as illustrated on the left side of the graph in FIG. 6, has the normal mode depicted by the solid line and the adjustment mode depicted by double lines. Specifically, the fine amplifier 11 has the gain codes of CF0 through CFm as the normal mode and further the gain codes (e.g., CFe1, CFe2 in FIG. 6) subsequent to CFm as the adjustment mode.

The fine amplifier 11 actualizes the values 0(dB) through G1(dB) as the gains when in the normal mode and also actualizes the values G1(dB) through G13(dB) as the gains when in the adjustment mode. The fine amplifier 11 receives a mode transit signal from the adjuster 19, thereby transiting to the adjustment mode from the normal mode or to the normal mode from the adjustment mode. The fine amplifier 11, when receiving the transit instruction to the adjustment mode, is enabled to receive additional gain codes CFm through CFem for the adjustment mode shown in FIG. 6 in addition to the gain codes CF0 through CFm provided for the normal mode.

A scheme of the second embodiment is to enable the additional gain codes for the adjustment mode to be received upon receiving the transit instruction to the gain characteristic mode, however, the transit to the adjustment mode may also be made by receiving the additional gain codes without receiving the transit instruction to the gain characteristic mode. The transit instruction to the gain characteristic mode and the gain code corresponding thereto in the second embodiment, correspond to the switch instruction and the expanded first gain set value in a first mode of the present invention.

A method of actualizing the gain characteristic mode of the fine amplifier 11 may involve providing, e.g., an adjustment amplifier for actualizing the adjustment mode, providing respective gates for accepting the gain codes in the individual adjustment modes, and also providing a function unit that controls a bias.

The adjuster 19, in the same way as in the first embodiment, adjusts the respective gain codes of the fine amplifier 11 and the coarse amplifier 12 so as to eliminate the gain step. The adjuster 19 according to the second embodiment retains a gain characteristic of the adjustment mode in addition to the gain characteristic of the normal mode of the fine amplifier 11. To be specific, the adjuster 19 retains the additional gain codes provided when in the adjustment mode of the fine amplifier 11 and the gains corresponding to these gain codes.

The adjuster 19, similarly to the first embodiment, determines the transit to the gain characteristic mode of the fine amplifier 11 when the gain step is detected based on the code difference given from the comparator 17 and if the gain code of the fine amplifier 11 becomes the maximum code CFm. The adjuster 19, when determining this transit, sends the mode transit instruction to the fine amplifier 11 and transmits the additional gain code corresponding to the adjustment mode. A specific method of adjusting the gain code by the adjuster 19 in the second embodiment will hereinafter be described.

OPERATIONAL EXAMPLE

Figure 7:
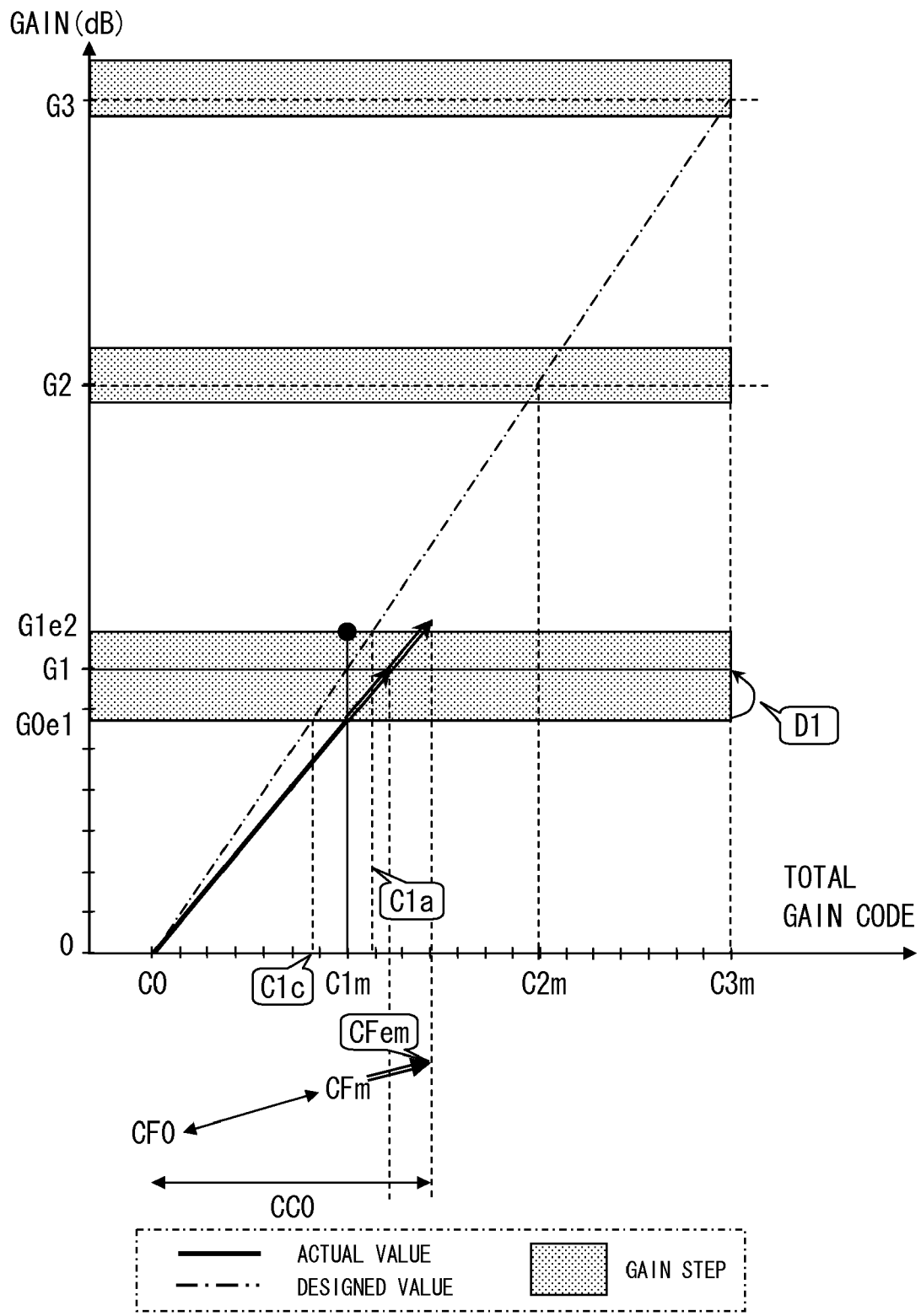
FIG. 7 is a graphic chart showing an operational example of the power control circuit in the second embodiment.
Figure 8:
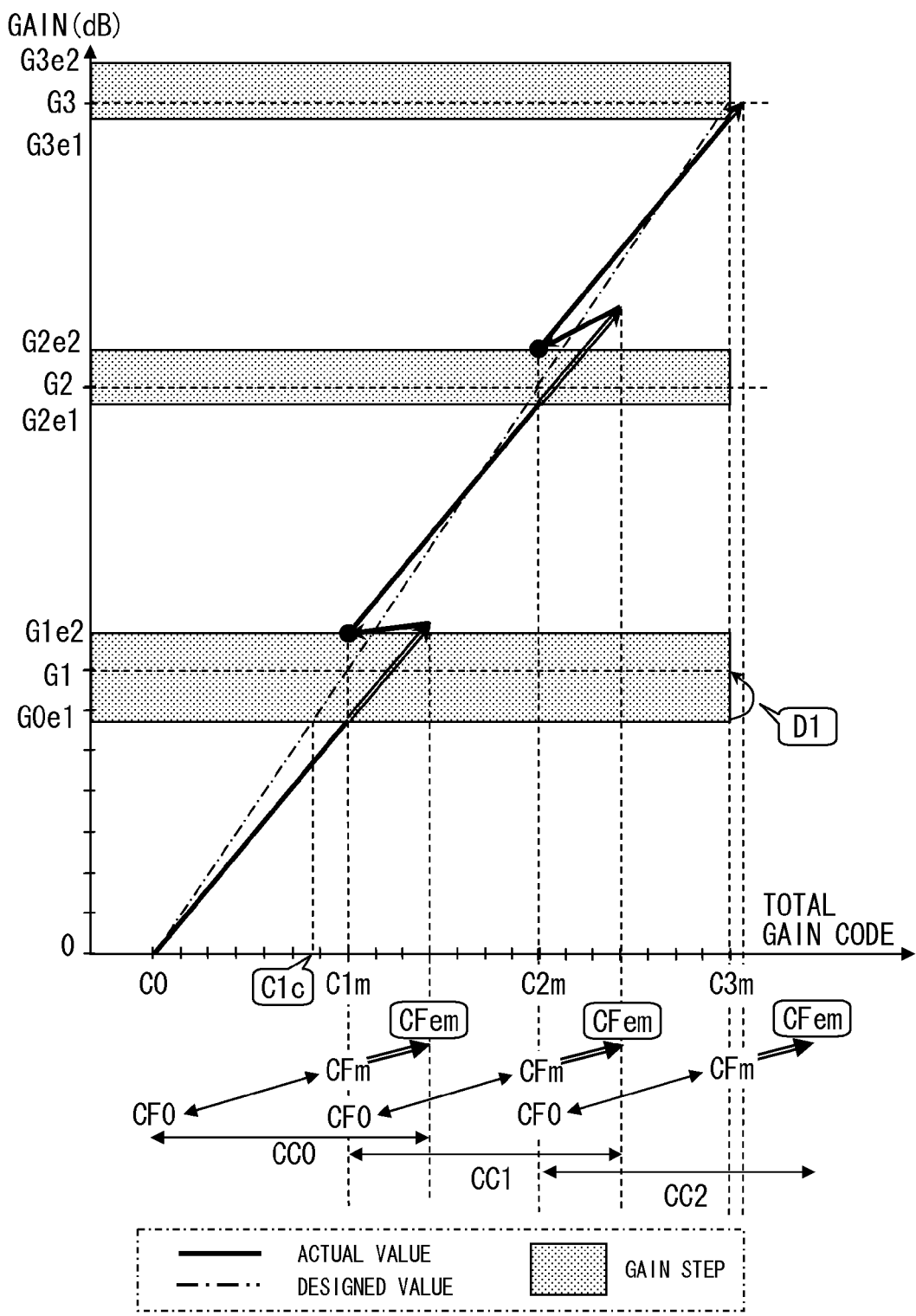
FIG. 8 is a graphic chart showing the operational example of the power control circuit in the second embodiment.

Next, an operational example of the power control circuit in the second embodiment discussed above will be described with reference to FIGS. 7 and 8. FIGS. 7 and 8 are graphic charts each showing an operational example of the power control circuit 5 in the second embodiment.

FIGS. 7 and 8 illustrate the operational examples in which the misalignment in the gain characteristic shown in FIG. 19 occurs in the fine amplifier 11 and the coarse amplifier 12 that build up the power control circuit 5. In FIGS. 7 and 8, the long chain line represents the in-design gain corresponding to the request gain code, the dot pattern area indicates the gain step that occurs in the conventional power control circuit, and the bold solid line and the double lines represent the gain control method realized by the power control circuit 5 in the second embodiment. As depicted by the bold solid line in FIGS. 7 and 8, the power control circuit 5 in the second embodiment controls the gain so that the gain step does not occur in the gain.

The operation of the power control circuit 5 in the second embodiment will hereinafter be discussed by exemplifying how a control signal containing a request gain code C1$m$ corresponding to the request output gain G1(dB) is inputted to the power control circuit 5 from the external circuit.

To begin with, the decoder 18 extracts the request gain code C1$m$ from the control signal. The decoder 18 determines, based on the request gain code C1$m$, without taking account of the misalignment in the gain characteristic, the gain code CFm for the fine amplifier 11 and the gain code CC0 for the coarse amplifier 12 each shown in FIG. 6. An assumption herein is that the thus-determined gain codes are sent, without being adjusted by the adjuster 19, to the fine amplifier 11 and the coarse amplifier 12, respectively.

The actual signal, which is gain-controlled with the gain codes by the fine amplifier 11 and the coarse amplifier 12, is fed back again at the coupler 13. The actual gain value of the power control circuit 5 in the second embodiment, which outputs the signal to be fed back, becomes G0e1(dB) due to the misalignment in the gain characteristic of the fine amplifier 11 illustrated in FIG. 19. Concomitantly, the comparator 17 determines the feedback gain code to be C1$c$.

At this time, the request gain code C1m is inputted from the decoder 18 to the comparator 17. Further, the gain code of the fine amplifier 11 and the gain code of the coarse amplifier 12, which are sent to the adjuster 19 from the decoder 18, remain to be CFm and CC0.

The comparator 17 compares the feedback gain code C1c with the request gain code C1m, and computes a difference therebetween. The comparator 17 determines that the thus-computed code difference (C1m–C1c) is not allowed, and sends this code difference to the adjuster 19.

The adjuster 19 tries, based on the code difference (C1m–C1c), to raise the gain code of the fine amplifier 11. In this case, the gain code is the maximum code CFm of the fine amplifier 11, and consequently the adjuster 19 raises the gain code of the coarse amplifier 12 up to CC1, and resets the gain code of the fine amplifier 11 to CF0. These gain codes (CF0, CC1) are sent to the fine amplifier 11 and the coarse amplifier 12, respectively.

The actual signal, which is gain-controlled with these gain codes by the fine amplifier 11 and the coarse amplifier 12, is fed back again at the coupler 13. The actual gain value of the power control circuit in the second embodiment, which outputs the signal to be fed back, becomes G1e2(dB) due to the misalignment in the gain characteristic of the fine amplifier 11 illustrated in FIG. 19.

Concomitantly, the comparator 17 determines the feedback gain code to be C1a. The comparator 17 determines whether the code difference between the feedback gain code C1a and the request gain code C1m is within the allowable range or not. Herein, the comparator 17 determines this code difference (C1a–C1m) is not allowed, and sends this code difference to the adjuster 19.

The adjuster 19 receives the gain code CF0 for the fine amplifier 11 and the gain code CC1 for the coarse amplifier 12, which are sent from the decoder 18, and the code difference (C1a–C1m) given from the comparator 17. The adjuster 19 determines, based on the code difference given from the comparator 17, that the feedback gain code is larger than the request gain code. With this determination, the adjuster 19 determines, as the gain code of the coarse amplifier 12 has been raised while the gain code of the fine amplifier 11 has been reset in the adjustment of the last time for obtaining the feedback gain code, that the gain step occurs.

When detecting the gain step, the adjuster 19 determines the transit to the gain characteristic mode of the fine amplifier 11. The adjuster 19 determines that the gain characteristic mode of the fine amplifier 11 transits to the adjustment mode from the present normal mode, resets the gain code CC1 of the coarse amplifier 12 that has been adjusted last time to the original gain code CC0, and determines the gain code of the fine amplifier 11 to be the additional gain code corresponding to the adjustment mode. The adjuster 19 determines, e.g., the gain code CFe1 shown in FIG. 6 as the additional gain code of the fine amplifier 11. The adjuster 19 transmits the transit signal of the gain characteristic mode and the gain code corresponding thereto respectively to the fine amplifier 11.

Thus, the adjuster 19 adjusts the additional gain code sent to the fine amplifier 11 till the gain G1 corresponding to the request gain code C1m is acquired. The example in FIG. 7 is that the desired gain G1 is acquired, in which the gain code sent to the fine amplifier 11 in the adjustment mode is smaller than the maximum additional gain code CFem.

Thus, according to the power control circuit 5 in the second embodiment, as illustrated in FIG. 8, even when the misalignment occurs in the gain characteristic with the result that the gain step is caused in the fine amplifier 11 and the coarse amplifier 12, the gain step is eliminated by changing the gain characteristic mode of the fine amplifier 11.

Operation and Effect in Second Embodiment

In the power control circuit 5 according to the second embodiment, under the same feedback control as in the first embodiment, the adjuster 19 adjusts the respective gain codes of the fine amplifier 11 and the coarse amplifier 12, which are determined by the decoder 18.

The fine amplifier 11 included in the power control circuit 5 in the second embodiment is constructed to have the 2-stage gain characteristics such as the normal mode and the adjustment mode with respect to the corresponding relationship between the respective output gains and the individual gain codes. When in the adjustment mode, the fine amplifier 11 is constructed to further include the additional gain code and to realize the output gain corresponding to this additional gain code.

In the adjuster 19, when the gain step is detected by the same method as in the first embodiment, the gain code of the coarse amplifier 12 is reset to the value of the last time, and the transit of the gain characteristic mode of the fine amplifier 11 is determined. When the gain characteristic mode of the fine amplifier 11 is determined to be the adjustment mode, the adjuster 19 determines the additional gain code of the fine amplifier 11. Hereafter, the adjuster 19 sequentially adjusts the additional gain code of the fine amplifier 11 up to the maximum additional gain code with a predetermined adjustment range till the code difference falls within the allowable range.

Thus, in the power control circuit 5 according to the second embodiment, when detecting the gain step, the gain characteristic mode of the fine amplifier 11 transits so as to eliminate the gain step.

Therefore, the power control circuit 5 in the second embodiment enables the gain control to be performed so as to eliminate the gain step without making a design including a sufficient allowance in a way that takes account of the misalignment in the gain characteristic with respect to the fine amplifier 11 and the coarse amplifier 12. Further, there is no necessity for making the design including the allowance, and hence the circuit scale and the power consumption/circuit scale can be restrained.

Third Embodiment

Next, the power control circuit in a third embodiment of the present invention will hereinafter be described with reference to the drawings. In the power control circuit 5 according to the first embodiment discussed above, the decoder 18 determines the gain codes of the fine amplifier 11 and the coarse amplifier 12, corresponding to the request gain code given from the external circuit, and, after the respective gain codes have been adjusted (corrected) by the adjuster 19 corresponding to the misalignment in the gain characteristic that occurs in each amplifier, the adjusted gain codes are sent to the fine amplifier 11 and the coarse amplifier 12. The power control circuit in the third embodiment includes a calibration mode, and, when in a calibrating operation, each of the gain codes output from the decoder 18 is controlled into a code taking account of the misalignment in the gain characteristic of each amplifier.

[Circuit Configuration]

Figure 9:
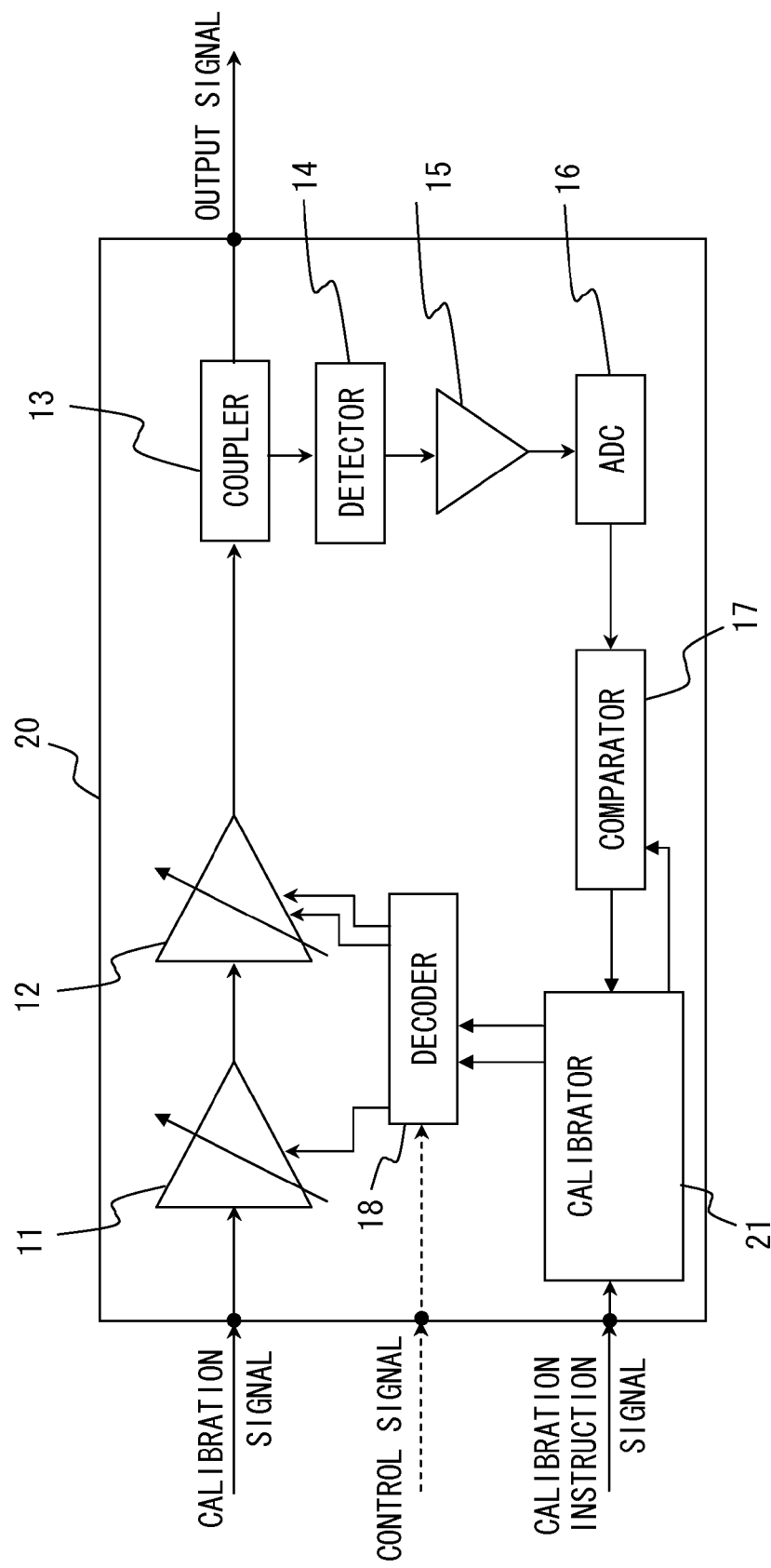
FIG. 9 is a function block diagram showing an outline of the circuit configuration of the power control circuit in a third embodiment.

A functional configuration of the power control circuit in the third embodiment will be explained with reference to FIG. 9. FIG. 9 is a function block diagram showing an outline of the circuit configuration of the power control circuit in the third embodiment.

A power control circuit 20 in the third embodiment has the calibration mode. When in the calibrating operation, the power control circuit 20 receives a calibration signal and a calibration instruction signal from the external circuit. The power control circuit 20 calibrates, through this calibrating operation, information on the corresponding relationships between the gain codes and the output gains with respect to the fine amplifier 11 and the coarse amplifier 12, which are held by the decoder 18, thereby controlling each of the gain codes output from the decoder 18 into the codes taking account of the misalignment in the gain characteristic of each amplifier.

The power control circuit 20 in the third embodiment includes a calibrator (CALIBRATOR) 21 that replaces the adjuster 19 included in the power control circuit 5 in the first embodiment. The following discussion will be focused on the function units different from those in the first embodiment.

The fine amplifier 11 and the coarse amplifier 12 are the same as those in the first embodiment, and have the gain characteristic, the gain characteristic mode shown in FIG. 2 and have the misalignment in the gain characteristic shown in, e.g., FIG. 19. Note that the relationship between the request gain code and the output gain corresponding thereto shall involve using the relationship illustrated in FIG. 18.

The decoder 18 receives the control signal from the external circuit similarly to the first embodiment other than when in the calibration (when performing the normal operation). The decoder 18 extracts the request gain code from the control signal, and determines each of the gain codes of the fine amplifier 11 and the coarse amplifier 12, corresponding to the request gain code. The decoder 18, on the occasion of determining each gain code, utilizes the gain characteristic information. The gain characteristic information represents the corresponding relationship between the gain codes and the gains corresponding thereto with respect to the fine amplifier 11 and the coarse amplifier 12, and is information based on the ideal value in terms of the specifications, which does not take account of the misalignment in the gain characteristic.

Further, the decoder 18 in the third embodiment has a control function related to the transit of the gain characteristic mode of the coarse amplifier 12, which is held by the adjuster 19 in the first embodiment. The decoder 18 determines each of the gain codes based on the gain characteristic information as shown in FIG. 10, and also determines the transit of the gain characteristic mode of the coarse amplifier 12.

FIG. 10 is a diagram showing an example of the gain characteristic information held by the decoder 18. The gain characteristic information held by the decoder 18 in the third embodiment contains, as illustrated in FIG. 10, in addition to the same corresponding relationship between the request gain code and the respective gain codes of the fine amplifier 11 and of the coarse amplifier 12 as in the first embodiment, information of the gain characteristic mode of the coarse amplifier 12. The decoder 18 retains the gain characteristic information as setting information of a table etc in a memory etc. The decoder 18 transmits the respective gain codes of the fine amplifier 11 and the coarse amplifier 12, which are determined based on the gain characteristic information, directly to the fine amplifier 11 and the coarse amplifier 12, and also sends, if necessary for the transit of the gain characteristic mode of the coarse amplifier 12, a transit instruction to the coarse amplifier 12.

The decoder 18 receives from the calibrator 21, when in the calibration, the respective gain codes of the fine amplifier 11 and the coarse amplifier 12 and the gain characteristic mode transit instruction of the coarse amplifier 12. At this time, the decoder 18 transmits the gain codes sent from the calibrator 21 directly to the fine amplifier 11 and the coarse amplifier 12, and also sends the gain characteristic mode transit instruction directly to the coarse amplifier 12.

Similarly, when in the calibration, the decoder 18 receives an update instruction of the gain characteristic information from the calibrator 21. The decoder 18, when receiving the update instruction of the gain characteristic information from the calibrator 21, updates the gain characteristic information based on the information contained in this instruction.

The calibrator 21 retains the same information as the gain characteristic information retained by the decoder 18. The gain characteristic information retained by the calibrator 21 is registered as the setting information in the memory etc. Note that the calibrator 21 may, when executing the calibrating operation, acquire the latest gain characteristic information from the decoder 18.

The calibrator 21, upon receiving a calibration instruction signal from the external circuit, starts conducting the calibrating operation. When starting the calibrating operation, at the first onset, the calibrator 21 determines the request gain code used for the calibration (which will hereinafter be refereed to as a calibration gain code). The calibrator 21 determines, based on the self-retained gain characteristic information, the respective gain codes of the fine amplifier 11 and the coarse amplifier 12 for obtaining the output gain corresponding to the calibration gain code. The calibrator 21 sends the thus-determined gain codes to the decoder 18 and the calibration gain code to the comparator 17.

The calibrator 21 receives a code difference between the feedback gain code and the calibration gain code from the comparator 17. The calibrator 21 adjusts (corrects), based this code difference, the respective gain codes of the fine amplifier 11 and the coarse amplifier 12 by the same method as done by the adjuster 19 in the first embodiment. The calibrator 21 repeats this adjustment till it is determined based on the information sent from the comparator 17 that the code difference is within the allowable range. The calibrator 21, when determining that the gain characteristic mode of the coarse amplifier 12 needs transiting in this adjustment, transmits the transit instruction of the gain characteristic mode together to the decoder 18.

The calibrator 21, when determining that the code difference is within the allowable range, determines that each of the gain codes determined at that time is an actually-measured value corresponding to the calibration gain code. The calibrator 21, upon determining the actually-measured value of each gain code, updates the self-retained gain characteristic information with this actually-measured value, and determines the next calibration gain code.

Thus, the calibrator 21 repeats this process about the request gain code allowed in the power control circuit 20, thereby calibrating the self-retained gain characteristic information. The calibrator 21, upon completion of calibrating the gain characteristic information, sends a gain characteristic information update instruction together with this information to the decoder 18.

The coupler 13, the detector 14, the adjustment amplifier 15 and the ADC 16 are the same as those in the first embodiment.

The comparator 17, similarly to the first embodiment, determines the feedback gain code. On the other hand, the comparator 17 receives the calibration gain code from the calibrator 21. The comparator 17 compares the feedback gain code with the calibration gain code. The comparator 17, when determining that the code difference between the feedback gain code and the calibration gain code is not within the allowable range, sends this code difference to the calibrator

21. A method of determining the code difference by the comparator 17 is the same as in the first embodiment.

OPERATIONAL EXAMPLE

Next, an operational example of the power control circuit 20 in the third embodiment discussed above will be explained with reference to FIG. 3. It is herein assumed that the power control circuit 20 in the third embodiment prepares the request gain codes C0 through C3m as exemplified in FIG. 3.

The power control circuit 20, when receiving a calibration instruction signal together with the calibration signal from the external circuit, starts the calibrating operation.

The calibrator 21, upon receiving the calibration instruction signal, changes the calibration gain code stepwise from C0 to C3m, and calibrates the gain code of each amplifier that corresponds to the calibration gain code on the basis of the code difference between the calibration gain code and the feedback gain code corresponding thereto, which code difference is sent from the comparator 17. Note that a method of determining the gain code of each amplifier corresponding to the predetermined calibration gain code by the calibrator 21 is the same as in the first embodiment. An operational example, in which the calibrator 21 determines C0c as the calibration gain code, will hereinafter be described along the example in FIG. 3.

The calibrator 21, when determining the calibration gain code C0c, determines, based on the self-retained gain characteristic information (see FIG. 10), the gain code of the fine amplifier 11 to be CFx and the gain code of the coarse amplifier 12 to be CC0, and also determines that the gain characteristic mode of the coarse amplifier 12 is the normal mode. The calibrator 21 transmits the gain code CFx to the fine amplifier 11 and the gain code CC0 to the coarse amplifier 12. Further, the calibrator 21 sends the calibration gain code C0c to the comparator 17.

The fine amplifier 11 and the coarse amplifier 12 perform the gain control of the calibration signal inputted from the external circuit, corresponding to the gain codes, which is thus sent from the decoder 18. The calibration signal is gain-controlled by the fine amplifier 11 and the coarse amplifier 12 and fed back at the coupler 13. With this feedback signal being utilized, the comparator 17 determines the feedback gain code corresponding to the actual gain actualized by the power control circuit in the third embodiment, which is gain-controlled corresponding to the calibration gain code. In this case, as described in the first embodiment, the gain value of the output signal becomes G0e2, and therefore the feedback gain code determined by the comparator 17 becomes C0a.

The comparator 17 compares the feedback gain code C0a with the calibration gain code C0c, thus computing a difference therebetween. The comparator 17 determines whether or not the thus-computed code difference is a difference falling within the allowable range. In this case, the comparator 17 determines that the code difference (C0c−C0a) is not allowed, and transmits this code difference to the calibrator 21.

The calibrator 21 receives the code difference from the comparator 17 and hence determines that the respective gain codes should be adjusted. To be specific, the calibrator 21 tries to, based on this code difference, raise the gain code of the fine amplifier 11. In this case, the gain code CFx is smaller than the maximum code CFm, and therefore the calibrator 21 further raises the gain code CFx of the fine amplifier 11. An assumption herein is that as a result of being adjusted by the calibrator 21, the gain code for the fine amplifier 11 is determined to be the maximum code CFm. Note that an adjustment range(width) of the gain code by the calibrator 21 may be set to whatever width in the same way as by the adjuster 19 in the first embodiment. The thus-adjusted gain codes (CFm, CC0) are sent to the fine amplifier 11 and the coarse amplifier 12, respectively.

With the thus-sent gain codes, the calibration signal, which is gain-controlled by the fine amplifier 11 and the coarse amplifier 12, is again fed back at the coupler 13. The actual gain value of the power control circuit in the third embodiment, which outputs the signal to be fed back, becomes G0e1 (dB). Concomitantly, the comparator 17 determines the feedback gain code to be C0b.

The calibrator 21 receives, from the comparator 17, the code difference (C0c−C0b) between the feedback gain code C0b and the calibration gain code C0c, and determines that the respective gain codes should be further adjusted.

The calibrator 21 tries to, based on this code difference, raise again the gain code of the fine amplifier 11. In this case, the gain code CFm is the maximum code of the fine amplifier 11, and hence the calibrator 21 increases the gain code of the coarse amplifier 12 up to CC1, and resets the gain code of the fine amplifier 11 to the initial value CF0. The thus-adjusted gain codes (CF0, CC1) are transmitted to the fine amplifier 11 and the coarse amplifier 12, respectively.

With the thus-sent gain codes, the actual signal, which is gain-controlled by the fine amplifier 11 and the coarse amplifier 12, is fed back again at the coupler 13. The actual gain value of the power control circuit in the third embodiment, which outputs the signal to be fed back, becomes G1e2(dB). Concomitantly, the ADC 16 determines the feedback gain code to be C1a.

The calibrator 21 receives the code difference (C0c−C1a) between the feedback gain code C1a and the calibration gain code C0c from the comparator 17, and determines that the feedback gain code is larger than the calibration gain code. With this determination, the calibrator 21, as the gain code of the coarse amplifier 12 has been raised while the gain code of the fine amplifier 11 has been reset in the adjustment of the last time for acquiring the feedback gain code, determines that the gain step occurs.

Upon detecting the occurrence of the gain step, the calibrator 21 determines the transit of the gain characteristic mode of the coarse amplifier 12. Specifically, the calibrator 21 determines that the mode transits to the first adjustment mode from the normal mode defined as the present gain characteristic mode. The calibrator 21 sends the same gain codes (CF0, CC1) as those of the last time to the fine amplifier 11 and the coarse amplifier 12, and transmits a transit instruction to the first adjustment mode to the coarse amplifier 12.

Thereafter, the fine amplifier 11 and the coarse amplifier 12 transiting to the first adjustment mode perform the gain-control of the calibration signal corresponding to the gain codes CF0, CC1. The thus-gain-controlled calibration signal is fed back again at the coupler 13. The feedback gain code corresponding to the actual gain G0e3(dB) of the power control circuit in the third embodiment, which outputs the signal to be fed back, is determined to be C0d.

The calibrator 21, since the code difference between the feedback gain code C0d and the calibration gain code C0c is not a difference falling within the allowable range, receives the code difference (C0c−C0d) from the comparator 17. The calibrator 21 determines, based on the code difference given from the comparator 17, that the feedback gain code is still larger than the calibration gain code. With this determination, the calibrator 21 determines that the gain step is not yet eliminated by the transit of the gain characteristic mode of the last time.

Through this operation, the calibrator 21 determines a further transit of the gain characteristic mode of the coarse amplifier 12. To be specific, the calibrator 21 determines that the gain characteristic mode of the coarse amplifier 12 transits to the second adjustment mode from the present first adjustment mode. The calibrator 21 sends the same gain codes (CF0, CC1) as those of the last time to the fine amplifier 11 and the coarse amplifier 12 respectively, and also sends the transit instruction to the second adjustment mode to the coarse amplifier 12.

Thereafter, the fine amplifier 11 and the coarse amplifier 12 transiting to the second adjustment mode perform the gain-control of the calibration signal corresponding to the gain codes CF0, CC1. The thus-gain-controlled calibration signal is fed back again at the coupler 13. The feedback gain code corresponding to the actual gain G0e2(dB) of the power control circuit in the third embodiment, which outputs the signal to be fed back, is determined to be C0a.

The calibrator 21, as the code difference between the feedback gain code C0a and the calibration gain code C0c is not a difference falling within the allowable range, receives the code difference (C0c–C0a) from the comparator 17. The calibrator 21 determines, after transiting to the second adjustment mode, the feedback gain code C0a becoming smaller than the calibration gain code C0c, determines that the gain step have been eliminated. With this determination, the calibrator 21 tries to, while fixing the gain characteristic of the coarse amplifier 12 to the second adjustment mode, raise the gain code of the fine amplifier 11. Through this operation, the calibrator 21 sends the same gain code CC1 as that of the last time to the coarse amplifier 12 in the second adjustment mode, and also transmits the gain code adjusted from the gain code CF0 of the last time to the fine amplifier 11.

Hereinafter, under the same feedback control as in the first embodiment, till the feedback gain code determined by the comparator 17 is equalized to the calibration gain code C0c or till the difference between both of the codes falls within the allowable range (as indicated by the star symbol depicted in FIG. 3), the calibrator 21 adjusts the gain code of the fine amplifier 11. Note that at this time the coarse amplifier 12 is in the second adjustment mode, and the gain code sent to the coarse amplifier 12 is CC1.

The calibrator 21, when determining that the code difference between the feedback gain code and the calibration gain code falls within the allowable range, reflects, in the self-retained gain characteristic information, the then-determined gain code (which is herein CFc) of the fine amplifier 11 and the then-determined gain code CC1 of the coarse amplifier 12 and the second adjustment mode defined as the gain characteristic mode of the coarse amplifier 12 as the respective values corresponding to the calibration gain code C0c. FIG. 11 is a diagram showing an example of the gain characteristic information after being calibrated by the calibrator 21.

The calibrator 21, when thus finishing the calibration of the gain characteristic information, transmits the calibrated gain characteristic information together with the update instruction to the decoder 18. The decoder 18, upon receiving this update instruction, updates the self-retained gain characteristic information with the gain characteristic information sent together with this instruction. For example, the decoder 18 comes to have the gain characteristic information as shown in FIG. 11 after the update. Note that the gain characteristic information update instruction may be sent to the decoder 18 from the calibrator 21 after completing all the calibrating operation and may also be sent thereto on the occasion of calibrating each value with respect to a predetermined calibration gain code.

Thus, according to the power control circuit 20 in the third embodiment, when performing the calibrating operation, the gain characteristic information held by the decoder 18 is calibrated in a status of taking account of the misalignments in the gain characteristics of the fine amplifier 11 and of the coarse amplifier 12. Accordingly, when in the normal operation, even when being gain-controlled directly with each gain code corresponding to the request gain code determined by the decoder 18, the gain step does not occur.

Moreover, the gain code adjustment method of each amplifier and the gain characteristic mode transit determination method of the coarse amplifier 12 by the calibrator 21 in the third embodiment, are the same as those by the adjuster 19 in the first embodiment, and can follow the functions of the adjuster 19 as they are, which have been described in the modified examples.

Operation and Effect in the Third Embodiment

In the power control circuit 20 according to the third embodiment, the start of the calibrating operation is triggered by receiving the calibration signal and the calibration instruction signal from the external circuit. When performing the calibrating operation, the calibrator 21 determines the calibration gain code, and the same feedback control as in the first embodiment is executed in a way that uses each determined calibration gain code as the request gain code.

Namely, the comparator 17 takes the code difference between the feedback gain code and the calibration gain code determined by the calibrator 21, and sends this code difference to the calibrator 21.

The calibrator 21 adjusts, based on the code difference given from the comparator 17, the respective gain codes of the fine amplifier 11 and the coarse amplifier 12 in the same way as by the adjuster 19 in the first embodiment so that the code difference falls within the allowable range. Further, the calibrator 21 detects the occurrence of the gain step based on the code difference in the same way as by the adjuster 19 in the first embodiment, and determines the transit of the gain characteristic mode of the coarse amplifier 12 so as to eliminate the gain step.

Thus, the gain code of the fine amplifier 11 and the gain code of the coarse amplifier 12 are determined so as to attain a status of equalizing the feedback gain code to the calibration gain code or having a difference falling within the allowable range, and the gain characteristic mode of the coarse amplifier 12 is determined. Then, the gain characteristic information of the decoder 18 is updated (calibrated) so that the thus-determined information are transmitted to the fine amplifier 11 and the coarse amplifier 12, corresponding to the calibration gain code (request gain code).

With this scheme, the power control circuit 20 in the third embodiment enables the linear gain control to be executed even if intactly gain-controlled with the gain codes corresponding to the request gain code determined by the decoder 18 and in the gain characteristic mode of the coarse amplifier 12 when in the normal operation after the completion of the calibrating operation.

Fourth Embodiment

Next, the power control circuit in a fourth embodiment of the present invention will hereinafter be described with reference to the drawings. The power control circuit 20 in the third embodiment discussed above is targeted at the same fine amplifier 11 and the same coarse amplifier 12 as those in the first embodiment. The power control circuit in the fourth embodiment is targeted at the same fine amplifier 11 and the same coarse amplifier 12 as those in the second embodiment.

[Circuit Configuration]

Figure 12:
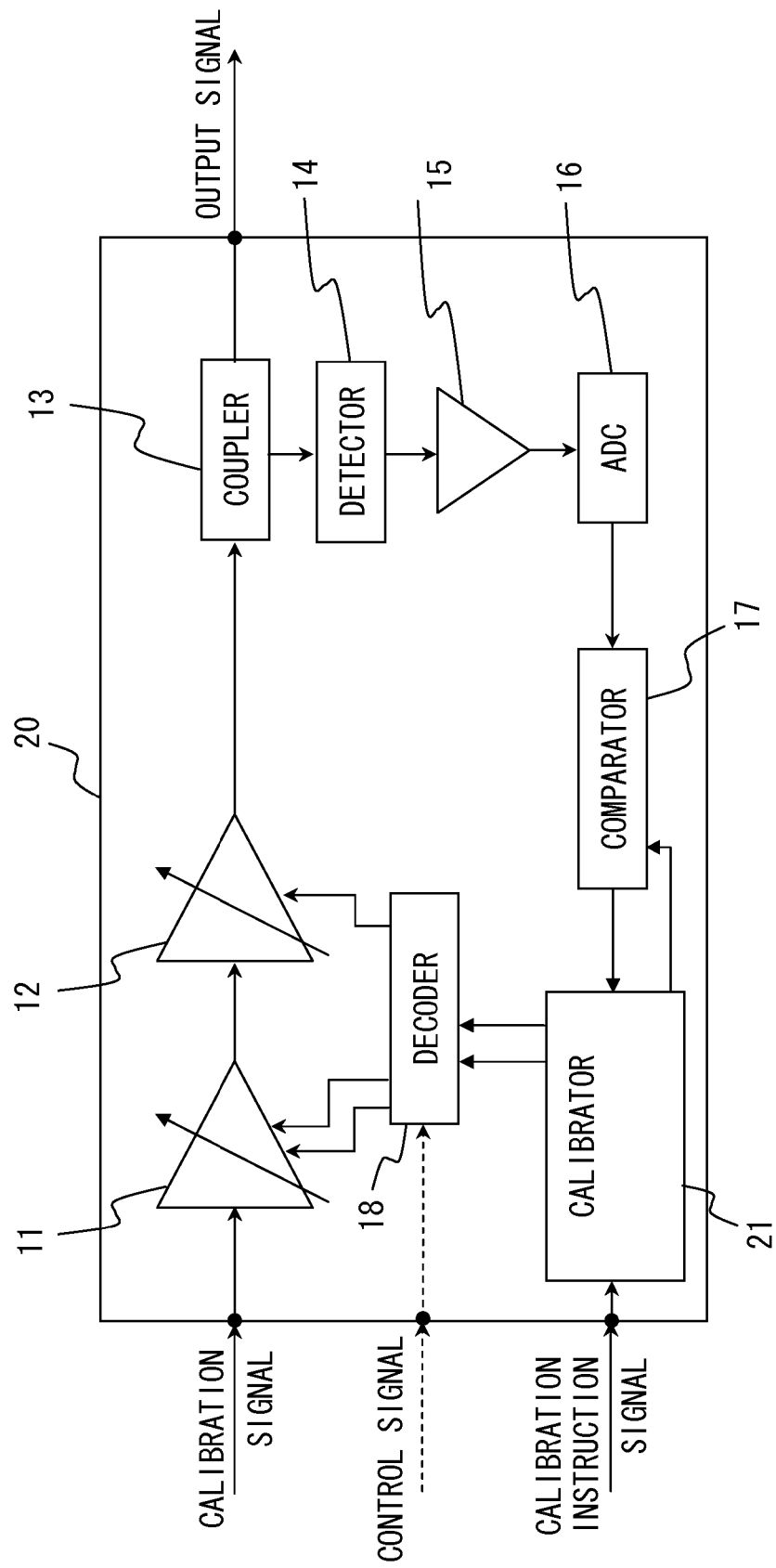
FIG. 12 is a function block diagram showing an outline of the circuit configuration of the power control circuit in a fourth embodiment.

A functional configuration of the power control circuit in the fourth embodiment will be explained with reference to FIG. 12. FIG. 12 is a function block diagram showing an outline of the circuit configuration of the power control circuit in the fourth embodiment.

In the power control circuit 20 according to the fourth embodiment, similarly to the second embodiment, the fine amplifier 11 has the gain characteristic mode. Accordingly, in the power control circuit 20 according to the fourth embodiment, the gain characteristic information held by the decoder 18 contains the information on the gain characteristic mode of the fine amplifier 11 in place of the gain characteristic mode of the coarse amplifier 12. The functions other than the functions related thereto are equal to the second embodiment. Hereinafter, the discussion will hereinafter be focused on the function unit different from the third embodiment.

Figure 18:
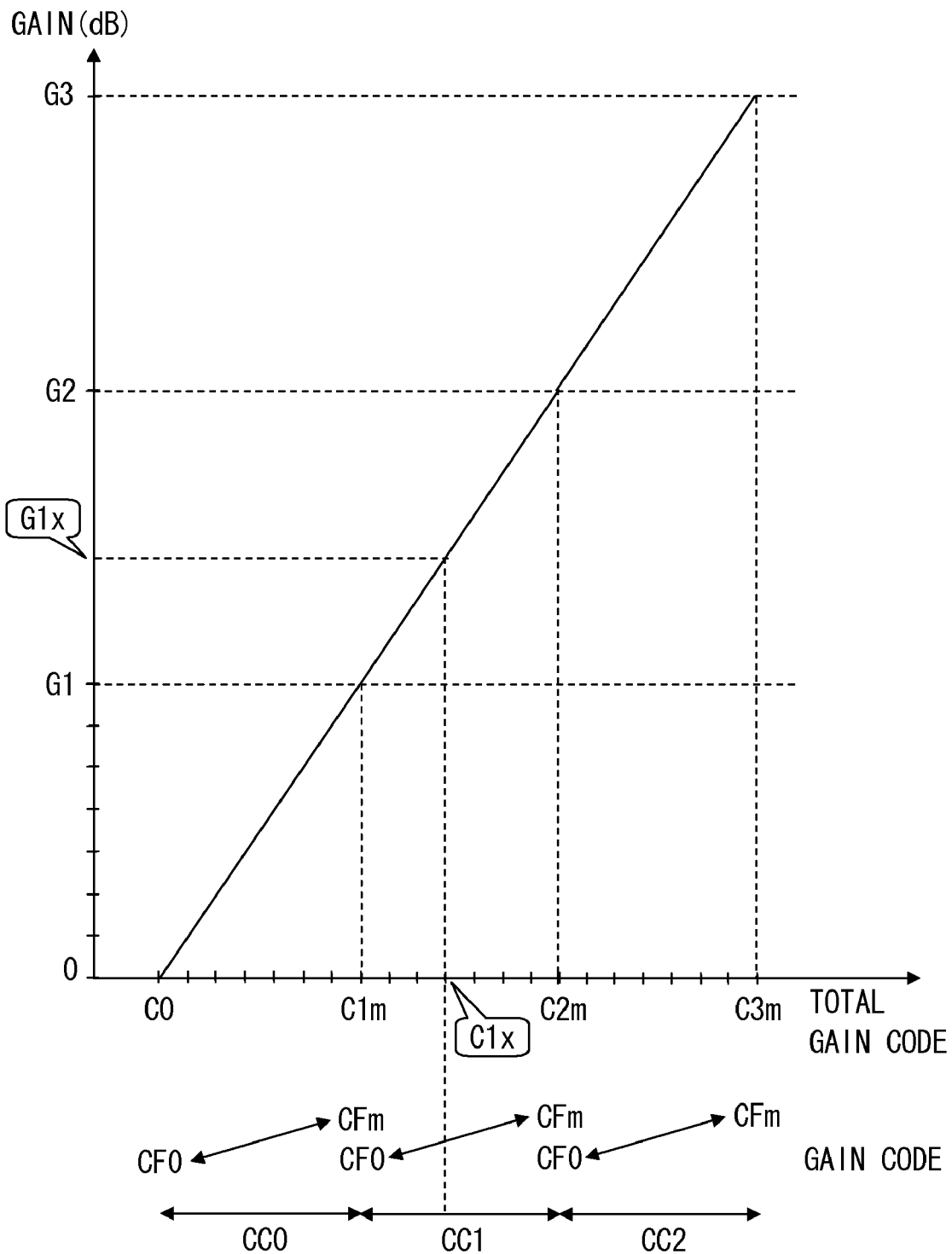
FIG. 18 is a graphic chart showing an example of the gain control of the conventional power control circuit.

Each of the fine amplifier 11 and the coarse amplifier 12 has, similarly to the second embodiment, the gain characteristic and the gain characteristic mode shown in FIG. 6, and also has the misalignment in the gain characteristic illustrated in FIG. 19. Note that the relationship between the request gain code and the output gain corresponding thereto is given as shown in FIG. 18.

The decoder 18 and the calibrator 21 in the fourth embodiment, except determining the transit of the gain characteristic mode of the fine amplifier 11 and determining the additional gain code of the fine amplifier 11, has the same function as in the third embodiment. FIG. 13 is a diagram showing an example of the gain characteristic information held by the decoder 18 in the fourth embodiment. Note that the calibrator 21 also retains the same information as the gain characteristic information held by the decoder 18.

As shown in FIG. 13, the decoder 18 retains, as values corresponding to the request gain code, the gain code of the fine amplifier 11, the gain code of the coarse amplifier 12 and the information on the gain characteristic mode of the fine amplifier 11 as the gain characteristic information. If the gain characteristic mode of the fine amplifier 11 is the adjustment mode, the additional gain code is set as the gain code of the fine amplifier 11. The decoder 18 determines, based on such a piece of gain characteristic information, the respective gain codes of the fine amplifier 11 and the coarse amplifier 12, and also determines the transit of the gain characteristic mode of the fine amplifier 11. The decoder 18, when determining the transit, sends the transit instruction thereof to the fine amplifier 11.

The calibrator 21, when performing the calibrating operation, calibrates the self-retained gain characteristic information into information taking account of the misalignments in the gain characteristics of the fine amplifier 11 and the coarse amplifier 12 by the same gain code adjustment method etc as by the adjuster 19 in the second embodiment. The calibrator 21 sends the update instruction of the gain characteristic information together with the thus-calibrated gain characteristic information to the decoder 18.

OPERATIONAL EXAMPLE

Next, the operational example of the power control circuit 20 in the fourth embodiment discussed above will be explained with reference to FIG. 7.

The power control circuit 20 in fourth embodiment, similarly to the third embodiment, when receiving the calibration instruction signal together with the calibration signal from the external circuit, starts the calibrating operation. When starting the calibrating operation, the decoder 18 and the calibrator 21 have the gain characteristic information as shown in FIG. 13. The operational example of how the calibrator 21 determines the calibration gain code to be $C1m$, will be described along the example in FIG. 7.

The calibrator 21, when determining the calibration gain code to be $C1m$, determines, based on the self-retained gain characteristic information (see FIG. 13), the gain code CFm of the fine amplifier 11 and the gain code CC0 of the coarse amplifier 12, and also determines that the gain characteristic mode of the fine amplifier 11 is the normal mode. The calibrator 21 transmits the gain code CFm to the fine amplifier 11 and the gain code CC0 to the coarse amplifier 12. Further, the calibrator 21 sends the calibration gain code $C1m$ to the comparator 17.

The fine amplifier 11 and the coarse amplifier 12 perform the gain control of the calibration signal inputted from the external circuit, corresponding to the gain codes, which is thus sent from the decoder 18. In this case, as described in the second embodiment, the gain value of the output signal becomes G0e1, and therefore the feedback gain code determined by the comparator 17 becomes $C1c$.

The comparator 17 compares the feedback gain code $C1c$ with the calibration gain code $C1m$, thus computing a difference therebetween. The comparator 17 determines whether or not the thus-computed code difference is a difference falling within the allowable range. In this case, the comparator 17 determines that the code difference $(C1m-C1c)$ is not allowed, and transmits this code difference to the calibrator 21.

The calibrator 21 receives the code difference from the comparator 17 and hence determines that the respective gain codes should be adjusted. The calibrator 21 tries to, based on this code difference, raise the gain code of the fine amplifier 11. In this case, the gain code is the maximum code CFm of the fine amplifier 11, and therefore the calibrator 21 raises the gain code up to CC1 and resets the gain code of the fine amplifier 11 to CF0. The thus-adjusted gain codes (CF0, CC1) are transmitted to the fine amplifier 11 and the coarse amplifier 12, respectively.

With the thus-sent gain codes, the calibration signal, which is gain-controlled by the fine amplifier 11 and the coarse amplifier 12, is again fed back at the coupler 13. The actual gain value on the occasion of outputting the signal to be fed back becomes G1e2(dB). Concomitantly, the ADC 16 determines the feedback gain code to be $C1a$.

The calibrator 21 receives, from the comparator 17, the code difference $(C1m-C1a)$ between the feedback gain code $C1a$ and the calibration gain code $C1m$, and determines that the feedback gain code is larger than the calibration gain code. With this determination, the calibrator 21, as the gain code of the coarse amplifier 12 has been raised while the gain code of the fine amplifier 11 has been reset in the adjustment of the last time for acquiring the feedback gain code, determines that the gain step occurs.

Upon detecting the occurrence of the gain step, the calibrator 21 determines the transit of the gain characteristic mode of the fine amplifier 11. Specifically, the calibrator 21 determines that the gain characteristic mode of the fine amplifier 11 transits to the adjustment mode from the present normal mode, resets the gain code CC1 of the coarse amplifier 12 that has been adjusted last time to the original gain code CC0, and determines the gain code of the fine amplifier 11 to be the additional gain code corresponding to the adjustment mode. The calibrator 21 determines the gain code CFe1 shown in, e.g., FIG. 6 as the additional gain code of the fine amplifier 11.

The calibrator 21 sends the gain characteristic mode transit signal and the additional gain code corresponding thereto to the fine amplifier 11, and also sends the gain code CC0 to the coarse amplifier 12.

Thereafter, the fine amplifier 11 transiting to the adjustment mode performs the gain-control of the calibration signal corresponding to the additional gain code, and the coarse amplifier 12 conducts the gain-control of the calibration signal corresponding to the gain code CC0. Thus, the calibrator 21 adjusts the additional gain code sent to the fine amplifier 11 till the output gain G1 corresponding to the calibration gain code C1$m$ is acquired. The example in FIG. 7 shows that the desired output gain G1 is acquired with such a code that the gain code transmitted to the fine amplifier 11 in the adjustment mode is smaller than the maximum additional gain code CFem.

The calibrator 21, when determining the additional gain code (which is set to e.g., CFec) of the fine amplifier 11 and the gain code CC0 of the coarse amplifier 12 for obtaining the output gain G1 corresponding to the calibration gain code C1$m$, reflects these pieces of information in the self-retained gain characteristic information as the information corresponding to the calibration gain code C1$m$. FIG. 14 is a diagram showing an example of the gain characteristic information after being calibrated by the calibrator 21.

The calibrator 21, when finishing calibrating the gain characteristic information in this way, transmits the calibrated gain characteristic information together with the update instruction to the decoder 18. The decoder 18, upon receiving this update instruction, updates the self-retained gain characteristic information with the gain characteristic information sent together.

As described above, according to the power control circuit 20 in the fourth embodiment, similarly to the third embodiment, when performing the calibrating operation, the gain characteristic information held by the decoder 18 is calibrated in the status of taking account of the misalignments in the gain characteristics of the fine amplifier 11 and the coarse amplifier 12.

Moreover, the gain code adjustment method of each amplifier and the gain characteristic mode transit determination method of the fine amplifier 11 by the calibrator 21 in the fourth embodiment, are the same as those by the adjuster 19 in the second embodiment. Accordingly, the calibrator 21 in the fourth embodiment may be constructed to have the function of the adjuster 19 described above by way of a modified example.

Operation and Effect in Fourth Embodimenta

In the power control circuit 20 according to the fourth embodiment, in the case of providing the fine amplifier 11 having the same gain characteristic mode as in the second embodiment, when in the calibrating operation, the gain characteristic information held by the decoder 18 is calibrated.

The calibrator 21 adjusts, based on the code difference given from the comparator 17, the respective gain codes of the fine amplifier 11 and the coarse amplifier 12 in the same way as by the adjuster 19 in the second embodiment so that the code difference falls within the allowable range. Further, the calibrator 21 detects, based on the code difference, the occurrence of the gain step in the same way as by the adjuster 19 in the second embodiment, and determines the transit of the gain characteristic mode of the fine amplifier 11 so as to eliminate the gain step. In a case where the gain characteristic mode of the fine amplifier 11 transits to the adjustment mode, the additional gain code corresponding thereto is determined.

The gain characteristic information of the decoder 18 is updated (calibrated) so that respective pieces of thus-determined information are sent to the fine amplifier 11 and the coarse amplifier 12, corresponding to the calibration gain code (request gain code).

With this scheme, the power control circuit 20 in the fourth embodiment enables the linear gain control to be executed even if intactly gain-controlled with the gain codes corresponding to the request gain code determined by the decoder 18 and in the gain characteristic mode of the fine amplifier 11 when in the normal operation after the completion of the calibrating operation.

First Modified Example

In the first through fourth embodiments, the feedback circuit includes the coupler 13, the detector 14, the adjustment amplifier 15 and the ADC 16, in which the power value of the signal to be fed back is measured, and the comparator 17 acquires the feedback gain code corresponding to the measured signal power value.

In the power control circuit 5 or 20 in each embodiment, the absolute gains of the fine amplifier 11 and the coarse amplifier 12 may be acquired from the input signal and the feedback signal before being gain-controlled by the fine amplifier 11 and the coarse amplifier 12, and the feedback gain codes corresponding to the absolute gains may also be determined (first modified example).

Figure 15:
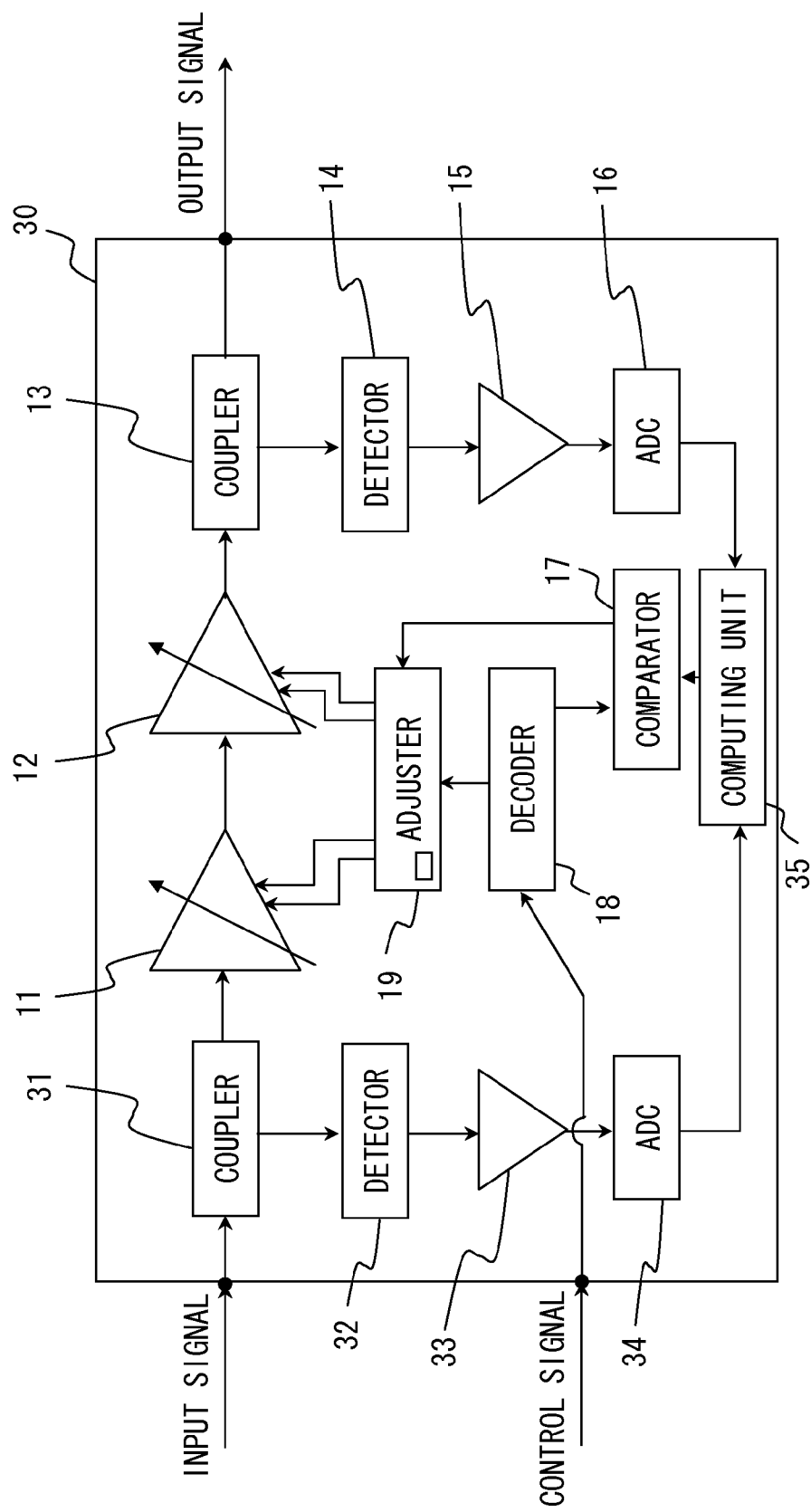
FIG. 15 is a block diagram showing a functional configuration of the power control circuit in a first modified example of the first embodiment and the second embodiment.
Figure 16:
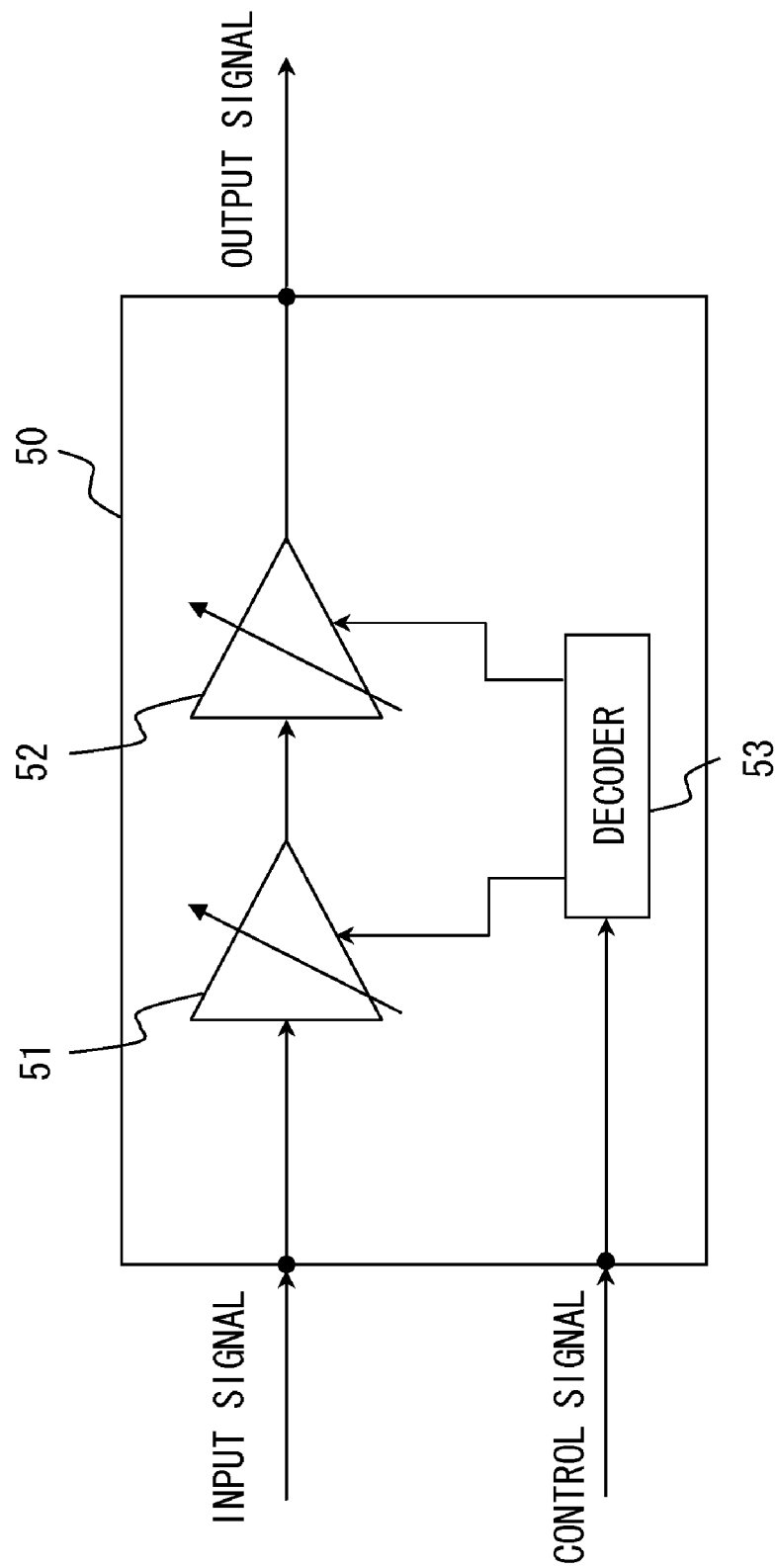
FIG. 16 is a diagram showing a variable gain amplifying circuit enabling line control to be attained by a conventional method.
Figure 17:
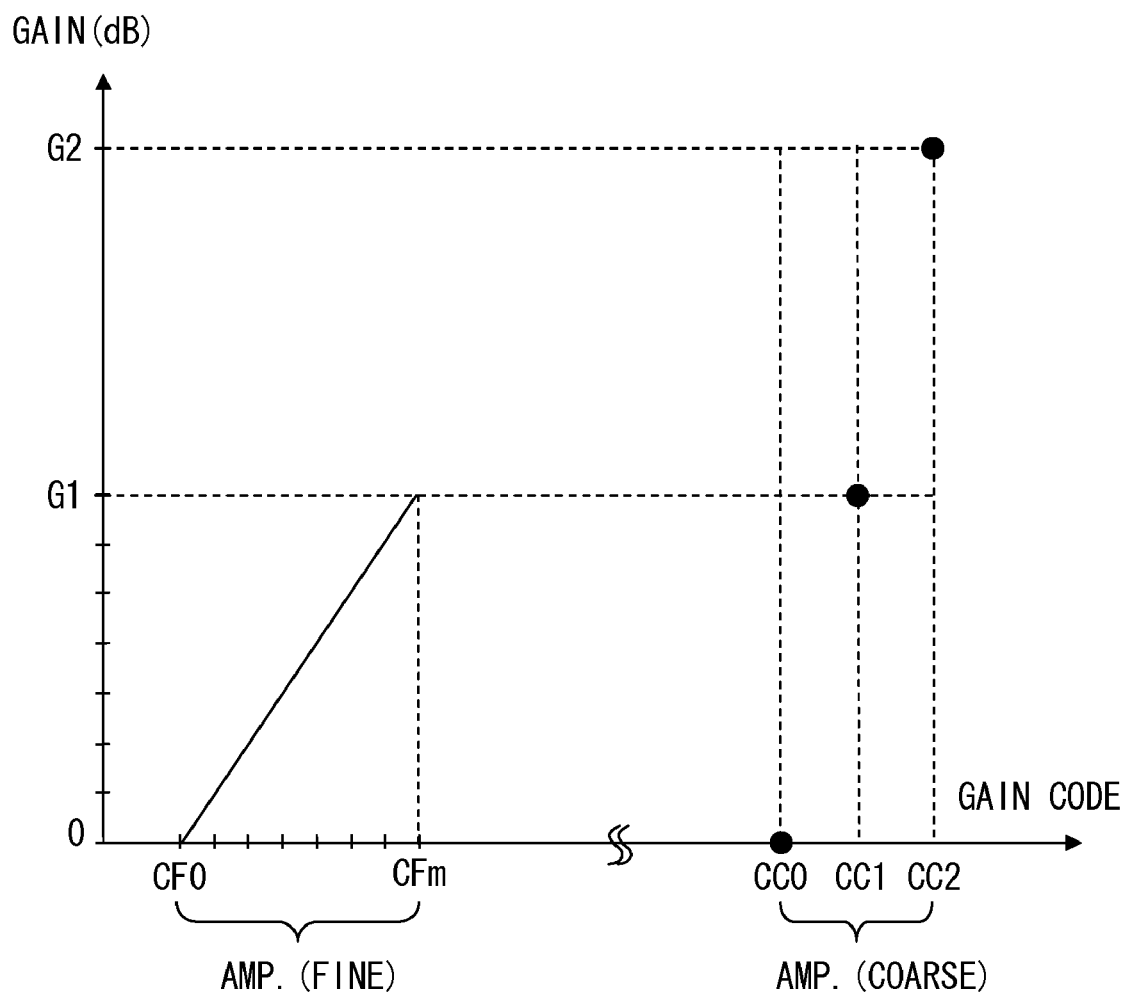
FIG. 17 is a graphic chart showing the gain characteristics of the fine amplifier and the coarse amplifier.

FIG. 15 is a block diagram showing a functional configuration of a power control circuit 30 in a first modified example of the first embodiment and the second embodiment.

As illustrated in FIG. 15, the power control circuit 30 in the first modified example further includes, in addition to the configurations in the first embodiment and the second embodiment discussed above, a coupler 31, a detector 32, an adjustment amplifier 33, an ADC 34 and a computing unit (COMPUTING UNIT) 35. The first modified example is that the coupler 31 branches the input signal before being gain-controlled, and the computing unit 35 acquires the absolute gains of the fine amplifier 11 and the coarse amplifier 12 on the basis of the input signal power value and the feedback signal power value. The absolute gains acquired by the computing unit 35 are transmitted to the comparator 17. The comparator 17 determines the feedback gain code corresponding to the absolute gain value.

Incidentally, FIG. 15 shows the modified example of the power control circuit 5 in the first embodiment and the second embodiment, however, the same modified example can be also applied to the power control circuit 20 in the third embodiment and the fourth embodiment. The third and fourth embodiment may have a scheme of acquiring the absolute gains of the fine amplifier 11 and the coarse amplifier 12 on the basis of the power value of the calibration signal and the power value of the feedback signal before being gain-controlled.

Second Modified Example

In the power control circuit 20 according to the third and fourth embodiments, the calibrator 21 calibrates the gain characteristic information held by the decoder 18 in the form of taking account of the misalignments in the gain characteristics of the fine amplifier 11 and the coarse amplifier 12. The power control circuit 20 according to the third and fourth embodiments may eliminate the gain step by controlling at least one bias of the fine amplifier 11 and the coarse amplifier 12 without calibrating the gain characteristic information of the decoder 18.

Moreover, each of the embodiments discussed above adopts such a connection sequence that the input signal is gain-controlled by the fine amplifier 11 and thereafter gain-controlled by the coarse amplifier 12 and may also takes such a connection sequence that the input signal is gain-controlled by the coarse amplifier 12 and thereafter gain-controlled by the fine amplifier 11.

[Others]

<Concerning Hardware Components and Software Components>

The hardware components represent hardware circuits exemplified by a Field Programmable Gate Array (FPGA), an Application Specific Integrated Circuit (ASIC), a gate array, a combination of the logic gates, a signal processing circuit, an analog circuit, etc.

The software components represent components (segments) for realizing the above-mentioned functions as the software but do not imply any concept that limits languages and development environments, etc, which realize the software. The software components are exemplified by a task, a process, a thread, a driver, firmware, a database, a table, a function, a procedure, a subroutine, a predetermined part of program codes, a data structure, an array, a variable, a parameter, etc. These software components are realized on a single or a plurality of memories (a single or a plurality of processors (e.g., a CPU (Central Processing Unit), a DSP (Digital Signal Processor), etc).

It is to be noted that the respective embodiments do not limit the methods of realizing the individual function units, and therefore the respective function units may be configured by the methods actualized by ordinary technicians in the field of the present technology by way of the hardware components or the software components or the combinations thereof.

What is claimed is:

1. A power control circuit configured to perform power control of an input signal in accordance with a required gain set value, comprising:
    a fine adjustment variable amplifying unit configured to amplify the input signal in accordance with a first gain set value;
    a coarse adjustment variable amplifying unit configured to amplify the input signal in accordance with a second gain set value, wherein a gain control range of the coarse adjustment variable amplifying unit is larger than a gain control range of the fine adjustment variable amplifying unit;
    a branching unit configured to branch an output signal, which is obtained by amplifying the input signal with the fine adjustment variable amplifying unit and the coarse adjustment variable amplifying unit, into a feedback signal;
    a comparing unit configured to compare a gain value between the input signal and the output signal with the required gain set value based on the feedback signal;
    a control unit configured to determine the first gain set value and the second gain set value based on the required gain set value; and
    an adjusting unit configured to adjust the first gain set value and the second gain set value determined by the control unit so that a power value of the feedback signal becomes a power value corresponding to the required gain set value in accordance with a result of the comparison by the comparing unit.

2. A power control circuit according to claim 1, wherein the coarse adjustment variable amplifying unit amplifies the input signal with different gain values between a normal operation mode and an adjustment operation mode for the same second gain set value, and
    the adjusting unit, if the comparing unit determines that the power value of the feedback signal is larger than the power value corresponding to the required gain set value, instructs the coarse adjustment variable amplifying unit to switch an operation mode from the normal operation mode to the adjustment operation mode.

3. A power control circuit according to claim 2, further comprising
    a calibrating unit configured to determine the required gain set value in simulation when receiving a calibration instruction signal,
    wherein the comparing unit compares the power value of the feedback signal after receiving the calibration instruction signal with the required gain set value determined by the calibrating unit, and
    the adjusting unit, if the power value of the feedback signal after receiving the calibration instruction signal becomes the power value corresponding to the required gain set value determined by the calibrating unit through the adjustment corresponding to a result of the comparison by the comparing unit, performs setting in the control unit so that the then-determined first gain set value and the then-determined second gain set value are immediately determined when the required gain set value, that is equal to the required gain set value determined by the calibrating unit, is sent from outside.

4. A power control circuit according to claim 3, wherein the adjusting unit, if the power value of the feedback signal after receiving the calibration instruction signal becomes larger than the power value corresponding to the required gain set value determined by the calibrating unit, performs setting in the control unit so as to instruct the coarse adjustment variable amplifying unit to switch the operation mode immediately when the required gain set value, that is equal to the required gain set value determined by the calibrating unit, is sent from outside.

5. A power control circuit according to claim 1, wherein the fine adjustment variable amplifying unit amplifies the input signal with different gain control ranges between a normal operation mode and an adjustment operation mode, the gain control range in the adjustment operation mode is larger than a gain control range in the normal operation mode corresponding to an expanded first gain set value, and
    the adjusting unit, if the comparing unit determines that the power value of the feedback signal is larger than the power value corresponding to the required gain set value, instructs the fine adjustment variable amplifying unit to switch an operation mode from the normal operation mode to the an adjustment operation mode and adjusts the first gain set value to the expanded first gain set value.

6. A power control circuit according to claim 5, further comprising
    a calibrating unit configured to determine the required gain set value in simulation when receiving a calibration signal and a calibration instruction signal,
    wherein the comparing unit compares a gain value between the calibration signal and the output signal after receiving the calibration signal with the required gain set value determined by the calibrating unit based on the feedback signal after receiving the calibration signal, and
    the adjusting unit, if the power value of the feedback signal after receiving the calibration signal becomes the power value corresponding to the required gain set value determined by the calibrating unit through the adjustment corresponding to a result of the comparison by the comparing unit, performs setting in the control unit so that the then-determined first gain set value and the then-determined second gain set value are immediately determined when the required gain set value, that is equal to the required gain set value determined by the calibrating unit, is sent from outside.

7. A power control circuit according to claim 6, wherein the adjusting unit, if the power value of the feedback signal after receiving the calibration signal becomes larger than the power value corresponding to the required gain set value determined by the calibrating unit, performs setting in the control unit so as to instruct the fine adjustment variable amplifying unit to switch the operation mode when the required gain set value, that is equal to the required gain set value determined by the calibrating unit, is sent from outside.

8. A power control circuit according to claim 1, further comprising:
    an input branching unit configured to branch the input signal;
    an input power detecting unit configured to detect a power value of the branched input signal; and
    a power detecting unit configured to detect a power value of the feedback signal,
    wherein the comparing unit acquires an actual gain value from the power value of the input signal that is detected by the input power detecting unit and from the power value of the feedback signal, and compares the actual gain value with the required gain set value.

9. A power control method of performing power control of an input signal in accordance with a required gain set value, comprising:
    a first amplifying step of making a fine adjustment variable amplifying unit amplify the input signal in accordance with a first gain set value;
    a second amplifying step of making a coarse adjustment variable amplifying unit amplify the input signal in accordance with a second gain set value, wherein a gain control range of the coarse adjustment variable amplifying unit is larger than a gain control range of the fine adjustment variable amplifying unit;
    a branching step of branching an output signal, which is obtained by amplifying the input signal with the fine adjustment variable amplifying unit and the coarse adjustment variable amplifying unit, into a feedback signal;
    a comparing step of comparing a gain value between the input signal and the output signal with the required gain set value based on the feedback signal;
    a control step of determining the first gain set value and the second gain set value based on the required gain set value; and
    an adjusting step of adjusting the first gain set value and the second gain set value determined in the control step so that the power value of the feedback signal becomes a power value corresponding to the required gain set value in accordance with a result of the comparison in the comparing step.

10. A power control method according to claim 9, wherein the coarse adjustment variable amplifying unit amplifies the input signal with different gain values between a normal operation mode and an adjustment operation mode for the same second gain set value, and
    the adjusting step includes, if it is determined in the comparing step that the power value of the feedback signal is larger than the power value corresponding to the required gain set value, instructing the coarse adjustment variable amplifying unit to switch an operation mode from the normal operation mode to the adjustment operation mode.

11. A power control method according to claim 9, wherein the fine adjustment variable amplifying unit amplifies the input signal with different gain control ranges between a normal operation mode and an adjustment operation mode, the gain control range in the adjustment operation mode is larger than a gain control range in the normal operation mode corresponding to an expanded first gain set value, and
    the adjusting step includes, if it is determined in the comparing step that the power value of the feedback signal is larger than the power value corresponding to the required gain set value, instructing the fine adjustment variable amplifying unit to switch an operation mode from the normal operation mode to the adjustment operation mode and adjusts the first gain set value to the expanded first gain set value.

* * * * *